(12) United States Patent
Furuta et al.

(10) Patent No.: US 8,660,506 B2
(45) Date of Patent: Feb. 25, 2014

(54) RESIDUAL SIGNAL GENERATING CIRCUIT, SUCCESSIVE APPROXIMATION AD CONVERTER, PIPELINED AD CONVERTER, AND RADIO RECEIVER

(75) Inventors: Masanori Furuta, Odawara (JP); Hirotomo Ishii, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/607,365

(22) Filed: Sep. 7, 2012

(65) Prior Publication Data

US 2013/0183920 A1 Jul. 18, 2013

(30) Foreign Application Priority Data

Jan. 13, 2012 (JP) ................... 2012-005476

(51) Int. Cl.
*G06F 3/033* (2013.01)
*H04K 3/00* (2006.01)

(52) U.S. Cl.
USPC ............................ 455/130; 341/110; 341/172

(58) Field of Classification Search
USPC ............................ 455/130; 341/110, 141, 172
See application file for complete search history.

(56) References Cited

U.S. PATENT DOCUMENTS 4,894,656 A * 1/1990 Hwang et al. ................. 341/120

FOREIGN PATENT DOCUMENTS

JP 07-038438 2/1995
JP 2009-032716 2/2009

OTHER PUBLICATIONS

Wei et al.: "A 0.024mm² 8b 400MS/s SAR ADC with 2b/Cycle and Resistive DAC in 65nm CMOS": ISSCC 2011/ Session 10/ NYQUIST-Rate Converters/ 10.5: pp. 188-189.

* cited by examiner

*Primary Examiner* — Lee Nguyen
(74) *Attorney, Agent, or Firm* — Holtz, Holtz, Goodman & Chick

(57) ABSTRACT

There is provided with a residual signal generating circuit in which the capacitive DA converter generates a first difference signal with respect to an input signal based on a criterion voltage, the criterion voltage being indicative of an input range of the input signal, the reference voltage generating circuit divides the criterion voltage to obtain at least one partial voltage signal, the residual signal generating section generates $2^N-1$ first residual signal according to a difference between the first difference signal and $2^{N-1}-1$ first reference signal, the $2^{N-1}-1$ first reference signal being $2^{N-1}-1$ partial voltage signal among said at least one partial voltage signal generated by the reference voltage generating circuit, the comparator compares the $2^N-1$ first residual signal with a fixed voltage to obtain $2^N-1$ first comparison signal each indicative of a logical value, and the decoder decodes the $2^N-1$ first comparison signal to obtain first data of N bits.

8 Claims, 18 Drawing Sheets

RESIDUAL SIGNAL GENERATING CIRCUIT, SUCCESSIVE APPROXIMATION AD CONVERTER, PIPELINED AD CONVERTER, AND RADIO RECEIVER

CROSS REFERENCE TO RELATED APPLICATIONS

This application is based upon and claims the benefit of priority from the prior Japanese Patent Application No. 2012-5476, filed on Jan. 13, 2012, the entire contents of which are incorporated herein by reference.

FIELD

Embodiments described herein relate to a residual signal generating circuit, a successive approximation AD converter, a pipelined AD converter, and a radio receiver.

BACKGROUND

For successive approximation (SAR) AD converters, a technique for improving resolution per cycle in order to increase sample frequency has been proposed (first conventional technique).

Furthermore, for a residual signal generating section of the successive approximation AD converter which is required for comparison, a technique using a 4-input amplifier has been proposed (second conventional technique).

Additionally, a technique for reducing the number of capacitive DACs in the successive approximation AD converter has been proposed (third conventional technique).

A circuit according to the first conventional technique mainly includes a plurality of (three) comparators, a plurality of (three) capacitive DACs, and a control circuit. More analog voltage comparison points need to be provided as the resolution is improved. Thus, a circuit of a type that converts a resolution of at least 2 bits at a time includes a plurality of comparators. An essential point of this circuit is that a plurality of capacitive DACs are used to generate a plurality of residual signals. The plurality of residual signals are connected to the respective comparators. Each of the comparators compares a residual signal with a ground voltage to determine the difference between the signals. The control circuit reflects the result of the comparison in the plurality of capacitive DACs, and repeats a successive approximation AD conversion a required number of times. The above-described circuit configuration improves the resolution per cycle. However, the configuration requires the same number of capacitive DACs as that of the comparators, disadvantageously increasing the area of the circuit.

A circuit according to the third conventional technique includes a plurality of (at least two) capacitances, a plurality of comparators, a resistive DAC, and a control circuit. An essential point of this circuit is that the number of capacitances is reduced by application of an interpolation technique.

In the interpolation, two source residual signals are provided and a plurality of residual signals are generated between the two residual signals. The technique allows the two capacitive DACs to generate residual signals that are supplied to the plurality of comparators. This enables a reduction in circuit area compared to the first conventional technique. In actuality, the third conventional technique simplifies the circuit configuration of the capacitances by separating the configuration of the capacitive DACs into the capacitances and the resistive DAC. However, even the interpolation requires at least two capacitances (or capacitive DACs), leading to the need for a reduction in the number of capacitive DACs. Furthermore, in actuality, the linear range of signals that can be handled within the circuit is not infinite, and it is thus difficult to achieve interpolation with a high resolution using the two capacitive DACs. Thus, the circuit according to the third conventional technique also has a challenge to reduce the area of the capacitive DACs (or capacitances).

A circuit according to the second conventional technique mainly includes a plurality of amplifiers (four inputs and one output), a plurality of comparators (encoders), and a residual amplifier. This circuit allows the 4 input 1 output amplifier to generate residual signals for the comparators. Reference voltages used for a residual calculation are generated by a resistive DAC. Unlike the circuit according to the first conventional technique, the circuit according to the second conventional, technique fails to include a circuit (sampler) that stores an input signal. Thus, the circuit cannot be applied to such a successive approximation AD converter as repeatedly uses the circuit to obtain a high resolution and a pipelined AD converter in which an AD converting operation and a residual signal amplifying operation do not temporally overlap. The circuit needs to increase the resolution of the resistive DAC and the numbers of amplifiers and comparators using power-of-two scaling, according to the resolution of the AD converter (flash AD converter). This disadvantageously increases the circuit area when a high-resolution AD converter is configured.

DETAILED DESCRIPTION

There is provided with a residual signal generating circuit including: a capacitive DA converter, a reference voltage generating circuit, a residual signal generating section, a comparator and a decoder.

The capacitive DA converter generates a first difference signal with respect to an input signal based on a criterion voltage, the criterion voltage being indicative of an input range of the input signal.

The reference voltage generating circuit divides the criterion voltage to obtain at least one partial voltage signal.

The residual signal generating section generates $2^N-1$ first residual signal according to a difference between the first difference signal and $2^{N-1}-1$ (N is an integer equal to or greater than 2) first reference signal, the $2^{N-1}-1$ first reference signal being $2^{N-1}-1$ partial voltage signal among said at least one partial voltage signal generated by the reference voltage generating circuit.

The comparator compares the $2^N-1$ first residual signal with a fixed voltage to obtain $2^N-1$ first comparison signal each indicative of a logical value.

The decoder decodes the $2^N-1$ first comparison signal to obtain first data of N bits.

Hereinafter, embodiments will be described below with reference to the drawings.

[First Embodiment]

Figure 1:
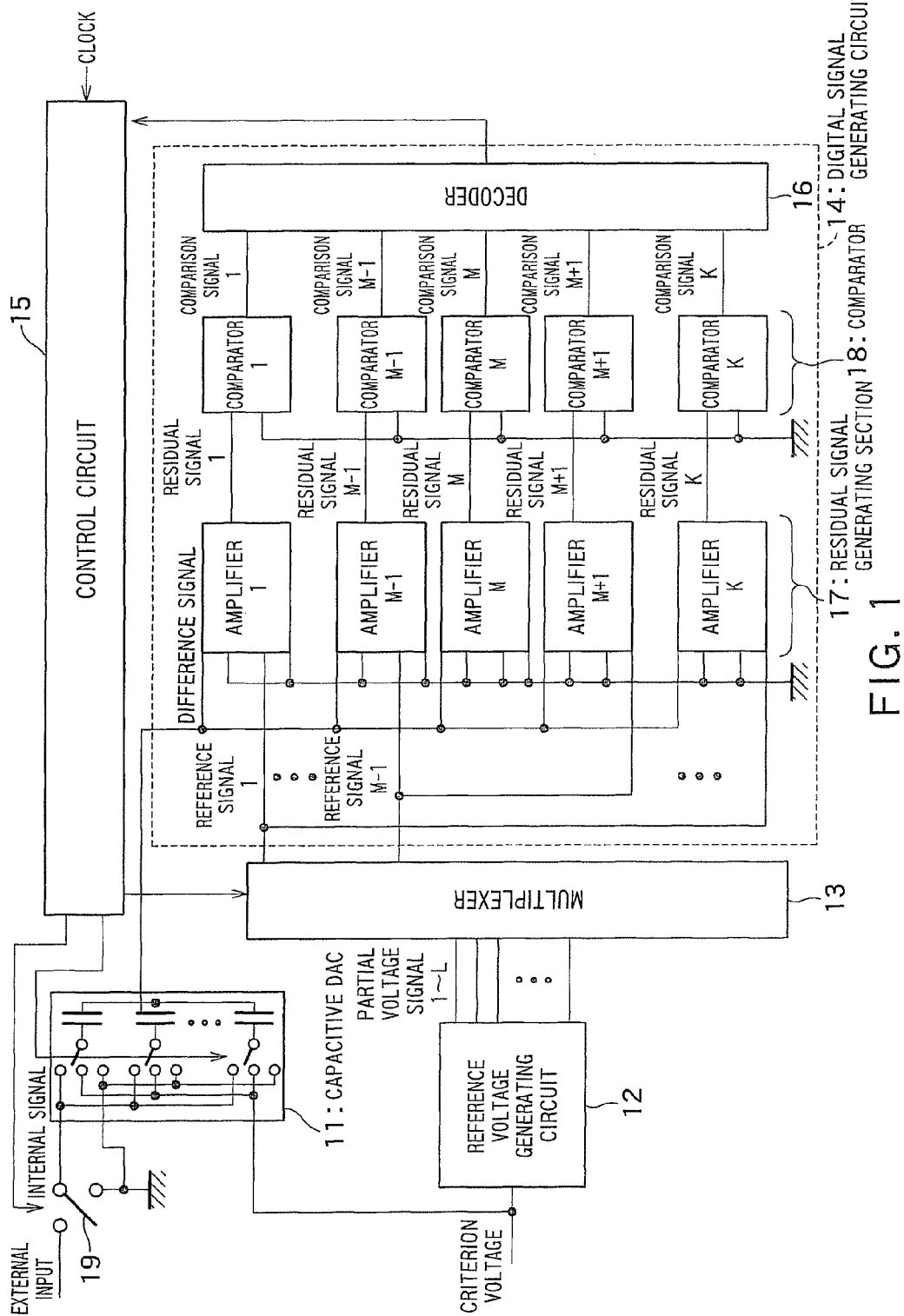
FIG. 1 is a diagram showing a residual signal generating circuit according to an embodiment.

FIG. 1 shows a residual signal generating circuit according to a first embodiment.

This circuit includes a capacitive DAC (capacitive DA converter) 11, a reference voltage generating circuit 12, a multiplexer 13, a digital signal generating circuit 14, and a control circuit 15. The digital signal generating circuit 14 includes a plurality of amplifiers 1 to K (residual signal generating section 17), a plurality of comparators 1 to K (comparator 18), and a decoder 16. Furthermore, the circuit includes an external input switch 19 on an input side thereof.

The circuit is characterized in that the circuit can be formed using one capacitive DAC regardless of whatever value the resolution per cycle has. The present residual signal generating circuit can be used as an AD converter without any change or applied to a successive approximation AD converter and pipelined AD converter as described below.

A capacitive DAC 11 includes a plurality of weighted capacitances and a plurality of switches each connected to one end of a corresponding one of the capacitances. Each switch switches between a criterion voltage terminal and ground and an external input terminal. The capacitive DAC 11 is connected to an input signal terminal via the external input switch 19. The external input switch 19 switches the connection between the input of the capacitive DAC and the external input terminal. An input signal is provided to the external input terminal. The capacitive DAC 11 controls each of the internal switches based on a criterion voltage to generate a difference signal with respect to the input signal. The criterion voltage is an AD converter reference voltage (which determines the full scale of the AD converter), and is indicative of the input range of the input signal. The difference signal generated by the capacitive DAC 11 are input to the amplifiers 1 to K, respectively.

The reference voltage generating circuit 12 divides the criterion voltage by a voltage divider or the like to generate at least one partial voltage signal (reference voltage).

The multiplexer 13 selects $2^{N-1}-1$ ("N" is an integer equal to or greater than 2) of the partial voltage signals as reference signals and outputs one of the reference signals to a corresponding one of the amplifiers 1 to K (except the amplifier M; "M" is an intermediate value between 1 and K). The control circuit 15 indicates to the multiplexer 13 which of the reference signals is to be selected and to which of the amplifiers the reference signal is to be output. "N" is indicative of the number of bits for AD conversion per cycle. "K" is indicative of the number of amplifiers and the number of comparators, and $K=2^N-1$. For example, for N=2, the multiplexer 13 selects one ($=2^{2-1}-1$) reference signal and outputs the selected reference signal to each of the amplifiers (two amplifiers because the intermediate amplifier is excluded due to K=3).

Each of the amplifiers 1 to K is a 4 input 1 output amplifier. The four input terminals of each of the amplifiers 1 to K (except the intermediate amplifier M) receive the difference signal from the capacitive DAC 11, the reference signal from the multiplexer 13, and two ground voltages, respectively. The four input terminals of the amplifier M receive the difference signal and three ground voltages, respectively. Each of the amplifiers 1 to K generates a residual signal based on the four inputs. Each of the comparators 1 to K compares the residual signal generated by a corresponding one of the amplifiers 1 to K with a ground voltage (predetermined voltage) to obtain a comparison signal indicative of a logical value (0 or 1).

The decoder 16 decodes the comparison signals obtained by the comparators 1 to K to acquire N-bit data.

The control circuit 15 controls an external input switch 19, the multiplexer 13, and the capacitive DAC 11. The control circuit 15 operates in accordance with an external clock.

Figure 2:
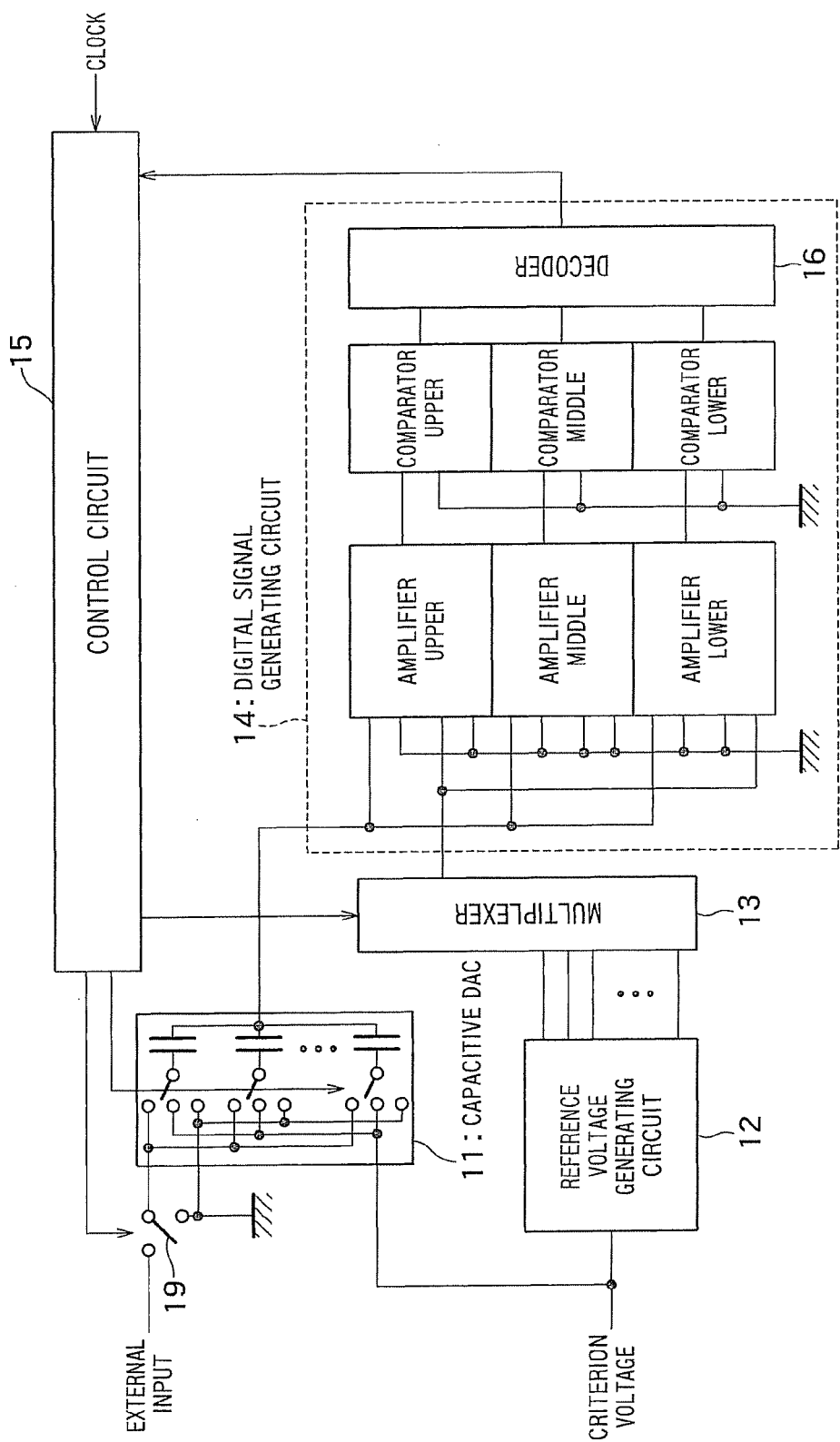
FIG. 2 is a diagram of a configuration of the circuit in FIG. 1 which uses a resolution of 2 bits for AD conversion.
Figure 3:
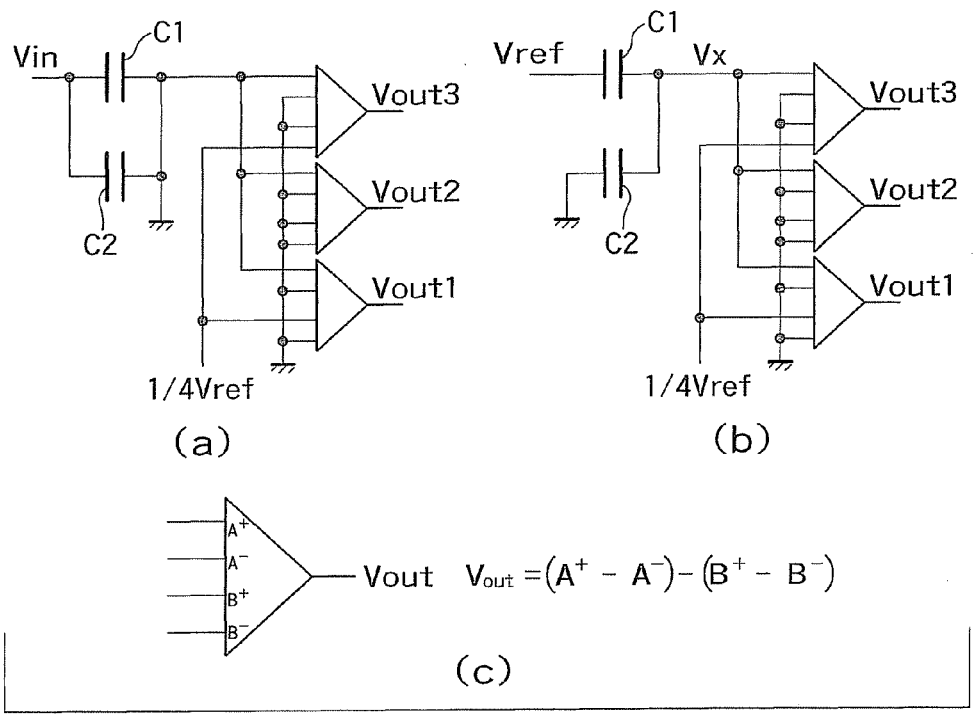
FIG. 3 is a diagram illustrating operation of the circuit in FIG. 2.

For easy understanding of the present circuit, FIG. 2 shows a circuit configuration in which the circuit in FIG. 1 is applied to a case of a 2-bit AD conversion (N=2). Three amplifiers (LOWER, MIDDLE, and UPPER) are provided, and three comparators (LOWER, MIDDLE, and UPPER) are provided. The circuit in FIG. 2 carries out a 2-bit AD conversion per cycle. Furthermore, FIG. 3 illustrates operation of the circuit in FIG. 2.

To carry out a 2-bit AD conversion, three residual signals are required as comparison voltages to be provided to the three comparators as indicated by:

$$V_{out1} = -V_{in} + \frac{1}{4}V_{ref} \quad (1)$$

$$V_{out2} = -V_{in} + \frac{2}{4}V_{ref} \quad (2)$$

$$V_{out3} = -V_{in} + \frac{3}{4}V_{ref} \quad (3)$$

Here, "Vref" denotes a criterion voltage.

"Vout1", "Vout2", and "Vout3" denote residual signals that are output voltages from the amplifiers. An output from the amplifier LOWER is denoted by "Vout1". An output from the amplifier MIDDLE is denoted by "Vout2". An output from the amplifier UPPER is denoted by "Vout3".

"Vin" denotes an input voltage (input signal).

Comparison signals 1, 2, and 3 output by the comparators LOWER, MIDDLE, and UPPER are thermometer codes. The comparison signals 1, 2, and 3 are converted into binary codes by the decoder 16, which outputs a 2-bit result of conversion.

Each of the outputs 1, 2, and 3 from the comparators LOWER, MIDDLE, and UPPER is set to "1" when Vout1, Vout2, Vout3>=0, and to "0" when Vout1, Vout2, Vout3<0. For example, when the 2-bit result of the conversion by the decoder 16 is expressed by D[1](MSB), D[0](LSB), then (D[1], D[0])=(1, 1) for (comparator output 1, comparator output 2, comparator output 3)=(1, 1, 1), (D[1], D[0])=(1, 0) for (comparator output 1, comparator output 2, comparator output 3)=(1, 1, 0), (D[], D[0])=(0, 1) for (comparator output 1, comparator output 2, comparator output 3)=(1, 0, 0), and (D[1], D[0])=(0, 0) for (comparator output 1, comparator output 2, comparator output 3)=(0, 0, 0). As shown in FIG. 3, the operation of the present circuit is roughly classified into two types, (a) signal sampling and (b) AD conversion.

In a signal sampling phase in FIG. 3(*a*), the difference between the input signal Vin and a ground signal is sampled using two capacitances C1 and C2 of the capacitive DAC. In an AD conversion phase in FIG. 3(*b*), the criterion voltage Vref is connected to the capacitance C1. The ground voltage is connected to the other capacitance C2. Then, the other terminals of the capacitances C1 and C2 (the terminals not connected to the criterion voltage or the ground voltage) are connected to input terminals of the respective amplifiers (the input terminals located highest with respect to the top of the sheet). Then, a voltage Vx (difference signal) provided to the input terminal is expressed by:

$$V_x = -V_{in} + \frac{1}{2} V_{ref} \qquad (4)$$

The present circuit allows each amplifier to generate a residual signal using the Vx (difference signal) and a reference signal Vref/4 provided by the multiplexer 13. More specifically, the reference voltage generating circuit 12 generates a Vref/4 as a reference voltage (partial voltage signal). The multiplexer 13 provides the Vref/4 to each amplifier.

Each amplifier is a 4 input 1 output amplifier. As shown in FIG. 3(C), when the input terminals of the amplifiers are denoted by A$^+$, A$^-$, B$^+$, and B$^-$, an output voltage from the amplifiers is expressed by:

$$V_{out} = (A^+ - A^-) - (B^+ - B^-) \qquad (5)$$

When the amplification factor of the amplifiers is 1, Vout1 and Vout3 are expressed by:

$$V_{out1} = -V_{in} + \frac{1}{4} V_{ref} \qquad (6)$$

$$V_{out3} = -V_{in} + \frac{3}{4} V_{ref} \qquad (7)$$

The residual signal Vout2 from the intermediate amplifier is the difference signal Vx proper. This is implemented by short-circuiting the B$^+$ and B$^-$ terminals of the amplifier MIDDLE (corresponding to the amplifier M in FIG. 1) to reduce the difference voltage to zero. Thus, the Vout2 is expressed by:

$$V_{out2} = -V_{in} + \frac{2}{4} V_{ref} \qquad (8)$$

Expressions (6), (7), and (8) have the same results as those of Expressions (1), (2), and (3). This indicates that Expressions (6), (7), and (8) can achieve the same calculations as those which are achieved by Expressions (1), (2), and (3).

FIG. 2 and FIG. 3 show an example with a resolution of 2 bits. However, the circuit can be similarly configured if the resolution is at least 3 bits. For example, the resolution of 3 bits requires the following seven types of residual signals.

$$-V_{in} + \frac{1}{8} V_{ref}, \qquad (9)$$

$$-V_{in} + \frac{2}{8} V_{ref},$$

$$-V_{in} + \frac{3}{8} V_{ref},$$

$$-V_{in} + \frac{4}{8} V_{ref},$$

$$-V_{in} + \frac{5}{8} V_{ref},$$

$$-V_{in} + \frac{6}{8} V_{ref},$$

$$-V_{in} + \frac{7}{8} V_{ref}$$

To achieve this, three types of reference signals Vref/8, 2*Vref/8, 3*Vref/8 may be provided. That is, the reference voltage generating circuit 12 generates at least Vref/8, 2*Vref/8, 3*Vref/8, and the multiplexer 13 selects and provides one of the three signals to each amplifier (except the amplifier M). The amplifier M short-circuits the B$^+$ and B$^-$ terminals to reduce the difference voltage between the terminals to zero, as described above.

Here, the relationship between the number of amplifiers, the number of comparators, the resolution, and the number of required reference voltages will be described.

In the circuit in FIG. 1, the amplifiers and the comparators are denoted by 1 to K, respectively (that is, "K" denotes the number of amplifiers and the number of comparators). When the resolution is denoted by "N", K=2$^N$-1 (K=3 for N=2, and K=7 for N=3).

Furthermore, in FIG. 1, the reference signals are denoted as 1 to (M−1). M=2$^{N-1}$ (M=1 for N=2, and M=4 for N=3). That is, the number of required reference signals is 2$^{N-1}$−1.

The circuit is characterized in that amplifier M+1 uses the reference signal M−1 and that the amplifier K uses the reference signal 1.

As described above, the present circuit enables simplification of a circuit configuration in which a plurality of bits in a sampled input signal are subjected to an AD conversion at a time. Specifically, the capacitive DACs can be formed into a single capacitive array.

Figure 4:
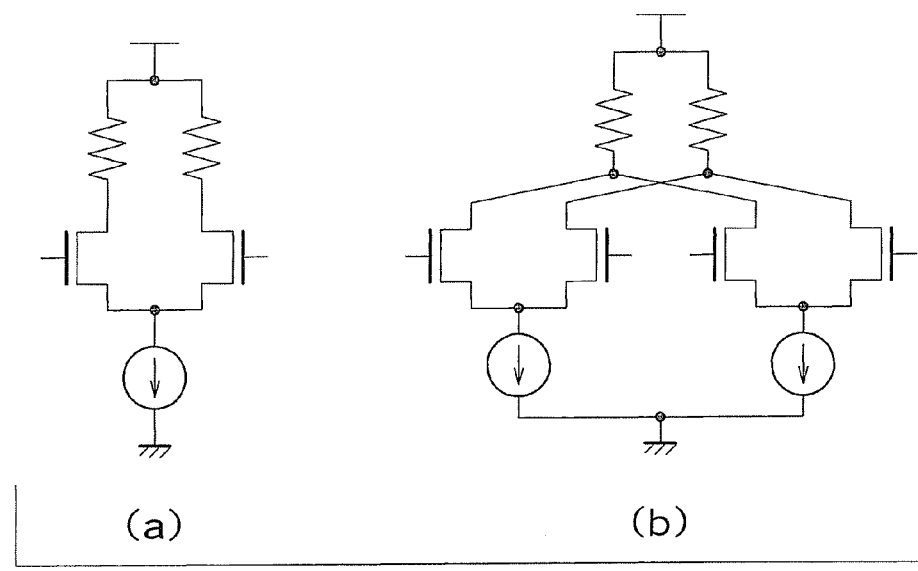
FIG. 4 is a diagram showing a specific example of an amplifying circuit.

Now, an example of configuration of an amplifier of a 4 input configuration will be described. In general, such a 2 input amplifier as shown in FIG. 4(*a*) is provided in a stage preceding the comparator in order to reduce an error in the comparator. In contrast, the present embodiment uses a 4 input amplifier as described above. The amplifier of the 4 input configuration can be configured simply by adding two input transistors and a current source to a circuit of a 2 input configuration as shown in FIG. 4(*b*).

As described above, the present embodiment enables the number of capacitive DACs to be reduced compared to the conventional technique (first conventional technique), advantageously allowing a reduction in circuit area.

The present embodiment also enables the number of capacitances (or capacitive DACs) to be reduced compared to the conventional technique obtained by application of the interpolation technique (third conventional technique), advantageously allowing a reduction in circuit area.

The conventional technique (second conventional technique) generates a residual signal using 4 input 1 output amplifiers but only calculates the residual signal with respect to a certain input signal and fails to provide a circuit with a signal sampling function such as capacitive DACs. This means that the circuit according to the second conventional technique fails to enable the present circuit to be applied to a successive approximation (SAR) AD converter using the circuit repeatedly and a pipelined AD converter including a plurality of the present circuits that are operated in a pipelined manner. Furthermore, the operational principle of the circuit according to the second conventional technique is different from the operational principle of the circuit according to the present embodiment. The circuit according to the present embodiment uses the difference signal generated by the capacitive DAC and the reference voltage (partial voltage signal) generated by the reference voltage generating circuit 12 to generate a plurality of residual signals. In contrast, the second conventional technique only generates a residual signal between a certain input signal and a resistive DAC that generates an absolute voltage.

The specification illustrates the single-ended circuit for simplification of description. However, the circuit may be configured using a differential circuit.

Furthermore, the specification describes the ground voltage. However, any fixed voltage may be used. The fixed voltage may be any voltage that does not vary during an AD converting process.

The ground voltage is a common voltage (the central voltage of the difference signal) in a differential circuit. The common voltage can be generated by short-circuiting a signal line between a positive circuit and a negative circuit included in the differential circuit.

[Second Embodiment]

Figure 5:
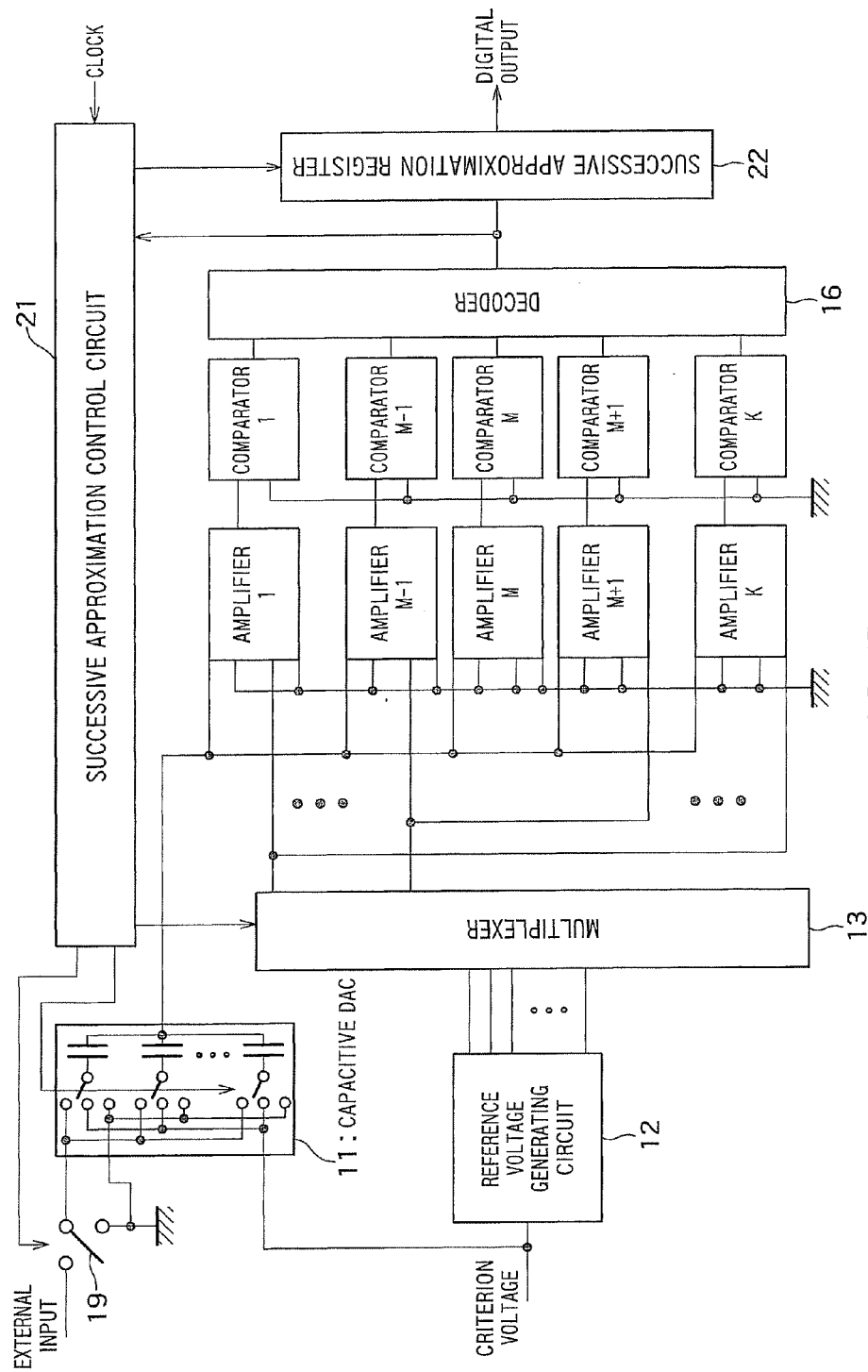
FIG. 5 is a diagram showing a successive approximation AD converter configured by application of the circuit in FIG. 1.
Figure 6:
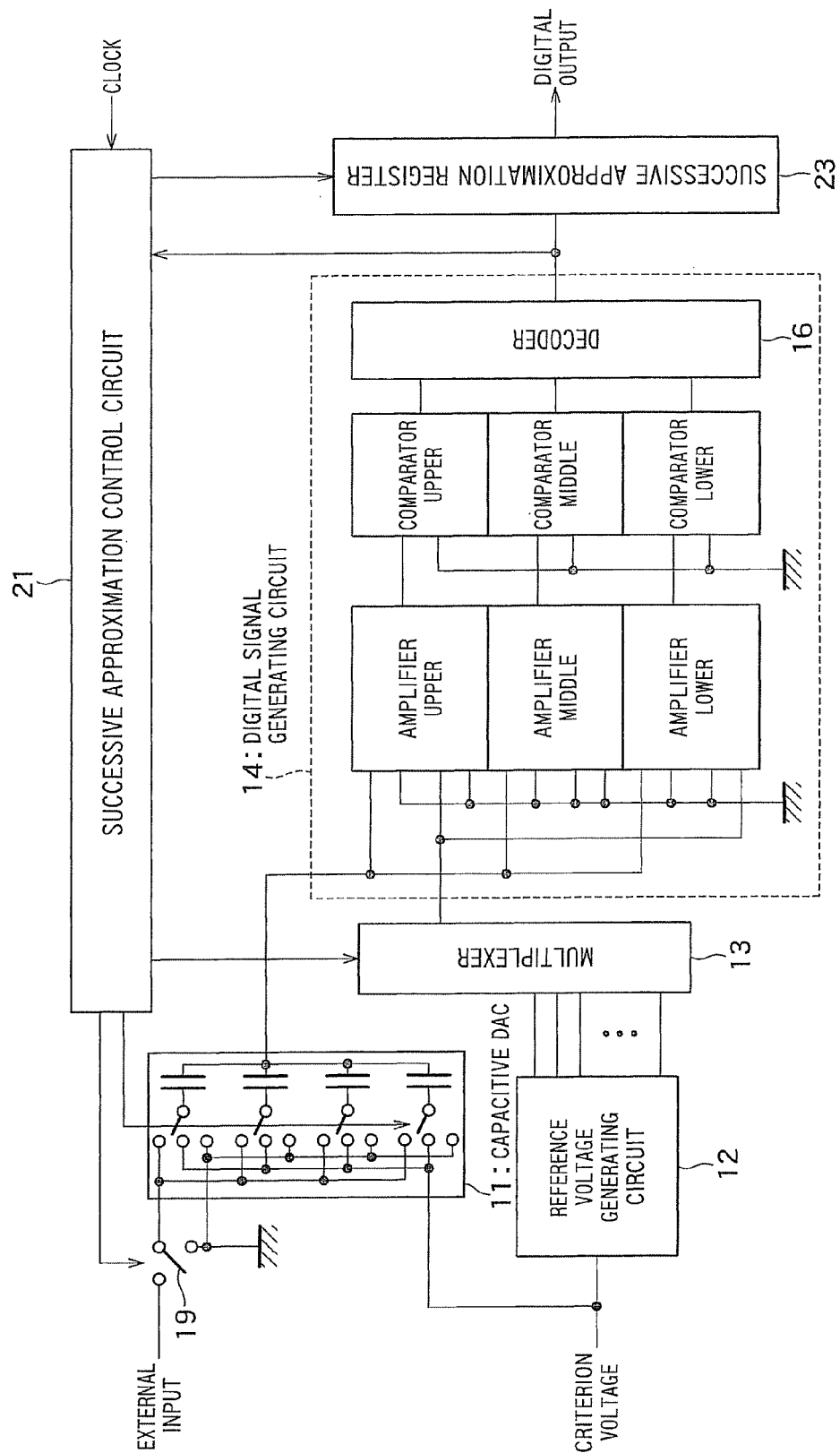
FIG. 6 is a diagram of a configuration of the circuit in FIG. 5 which uses a resolution of 4 bits for AD conversion.

FIG. 5 is a circuit diagram of a successive approximation AD converter according a second embodiment. A circuit shown in FIG. 5 is an embodiment in which the residual signal generating circuit in FIG. 1 is applied to a successive approximation AD converter. In the present circuit, the control circuit in FIG. 1 is replaced with a successive approximation control circuit 21, and a successive approximation register 22 is additionally provided. Circuit components with the same names as those in FIG. 1 are denoted by the same reference numerals in FIG. 1, and duplicate descriptions are omitted except for expanded processing. For easy understanding of the present embodiment, FIG. 6 shows a circuit configuration in which the circuit in FIG. 5 is applied to a case where 2 bits are subjected to an AD conversion in one cycle. The circuit in FIG. 6 is a successive approximation AD converter that carries out a 4-bit AD conversion. A 4-bit AD conversion is carried out in two cycles, and the resolution per cycle is 2 bits. The circuit in FIG. 6 includes more capacitances forming a capacitive DAC and more reference voltages (partial voltage signals) generated by the reference voltage generating circuit 12 than the circuit in FIG. 2 according to the first embodiment. A successive approximation register 23 stores data for two cycles. The reference voltage generating circuit 12 generates two types of reference voltages Vref/4 and Vref/16.

Figure 7:
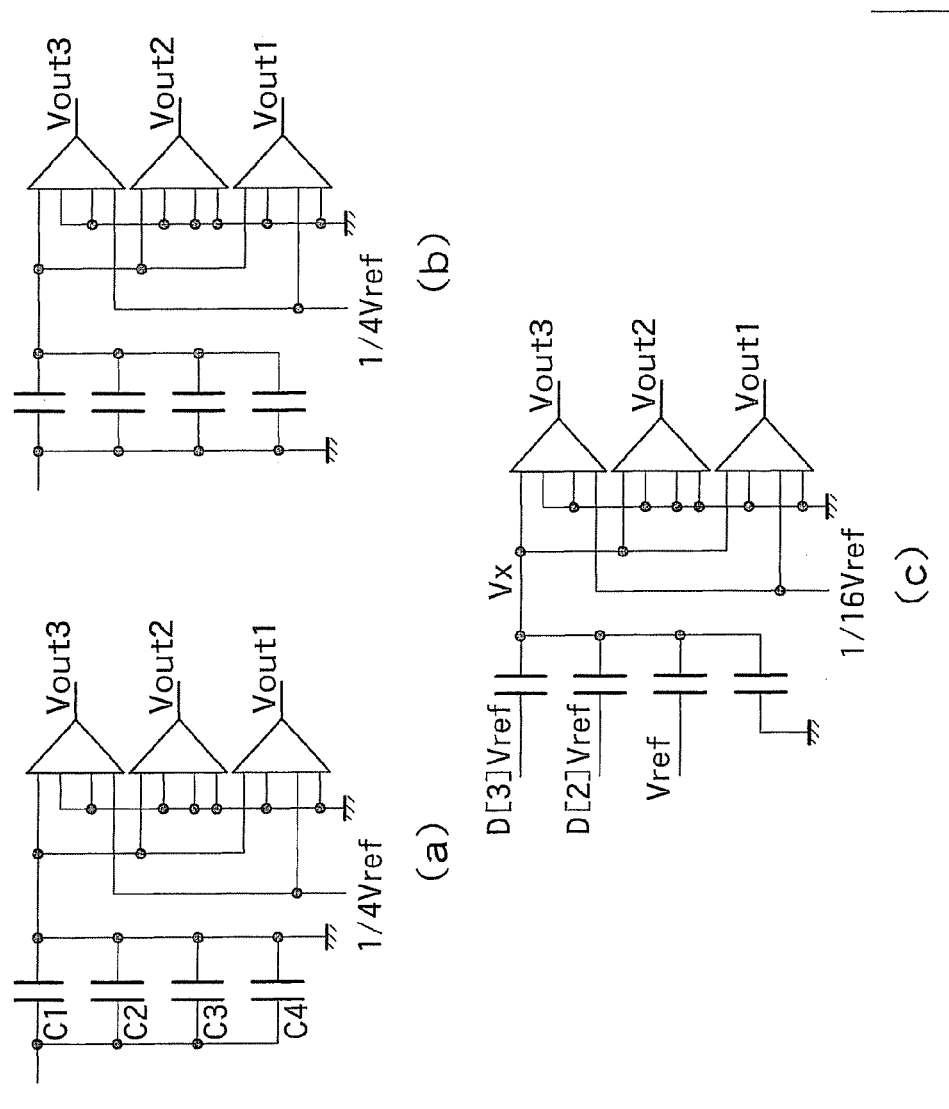
FIG. 7 is a diagram illustrating operation of the circuit in FIG. 6.

FIG. 7 illustrates operation of the circuit in FIG. 6. The capacitive DAC includes four capacitances C1, C2, C3, and C4. The relationship among the capacitances is 4*C1=2*C2=C3=C4. The operation of the present circuit includes signal sampling in FIG. 7(a), an AD converting cycle 1 in FIG. 7(b), and an AD converting cycle 2 in FIG. 7(c).

In the signal sampling phase, the difference voltage between the input signal Vin and the ground voltage are sampled using the four capacitances (FIG. 7(a)).

In the AD converting cycle 1 phase, a criterion voltage Vref is connected to one terminal of the capacitance C1, and the ground voltage is connected to the other capacitances (FIG. 7(b)). The other terminals of the capacitances C1 to C4 are connected to the input terminals of the respective amplifiers. Then, the difference signal Vx that is an output from the capacitive DAC is, as is the case with Expression (4), expressed by:

$$V_x = -V_{in} + \frac{1}{2}V_{ref} \tag{10}$$

This difference signal and the reference signal Vref/4 are used to perform a 2-bit AD converting operation. In the cycle 1 phase, the multiplexer 13 selects and outputs the Vref/4, one of the two partial voltage signals (reference voltages). The amplifiers and comparators operate in the same manner as that in FIG. 2. Outputs from the comparators are each decoded by the decoder 16, which outputs the result of the decoding to the successive approximation control circuit 21. Furthermore, the result of the decoding (D[3], D[2]) is saved to the successive approximation register 23. The result of the decoding in the AD converting cycle 1 is as follows.

(D[3], D[2])=(1, 1) for (comparison output 1, comparison output 2, comparison output 3)=(1, 1, 1)

(D[3], D[2])=(1, 0) for (comparison output 1, comparison output 2, comparison output 3)=(1, 1, 0)

(D[3], D[2])=(0, 1) for (comparison output 1, comparison output 2, comparison output 3)=(1, 0, 0)

(D[3], D[2])=(0, 0) for (comparison output 1, comparison output 2, comparison output 3)=(0, 0, 0)

Then, the circuit operation shifts to the AD converting cycle 2 phase. In this phase, the results of the conversion D[3] and D[2] obtained during the cycle 1 phase are used to generate a difference signal (FIG. 7(c)). More specifically, the D[3]Vref is connected to one end of the capacitances C1, the D[2]Vref is connected to one end of the capacitance C2, and the Vref is connected to the C3. The ground voltage is connected to one terminal of the C4. In this case, the difference signal Vx is expressed by:

$$V_x = -V_{in} + \frac{1}{2}D[3]V_{ref} + \frac{1}{4}D[2]V_{ref} + \frac{1}{8}V_{ref} \tag{11}$$

The second and third items on the right side of Expression (11) are indicative of signals that depend on the results of the conversion obtained during the cycle 1. In the cycle 2, the Vref/16 is used as a reference signal. That is, in the cycle 2 phase, the multiplexer 13 selects and outputs the Vref/16, one of the two partial voltage signals. When the amplification factor of the amplifiers is 1, outputs Vout1, Vout2, and Vout3 from the three amplifiers are as follows.

$$V_{out1} = -V_{in} + \frac{1}{2}D[3]V_{ref} + \frac{1}{4}D[2]V_{ref} + \frac{1}{16}V_{ref} \quad (12)$$

$$V_{out2} = -V_{in} + \frac{1}{2}D[3]V_{ref} + \frac{1}{4}D[2]V_{ref} + \frac{1}{8}V_{ref} \quad (13)$$

$$V_{out3} = -V_{in} + \frac{1}{2}D[3]V_{ref} + \frac{1}{4}D[2]V_{ref} + \frac{3}{16}V_{ref} \quad (14)$$

These expressions indicate that the circuit in FIG. 6 can express the outputs from the amplifiers ranging from Vref/16 (D[3]=0, D[2]=0) to 15*Vref/16 (D[3]=1, D[2]=1) at Vref/16 increments. Outputs from the comparators are decoded by the decoder 16, which stores the results of the decoding in the successive approximation register. At this time, the results of the decoding are D[1] and D[0].

The above-described operation allows the circuit in FIG. 6 to implement an AD converter that achieves a resolution of a total of 4 bits in D[3] to D[0] by two successive approximation operations.

This example illustrates the 4-bit configuration. However, any bits can be dealt with by increasing the number of cycles, the number of reference voltages, and the number of capacitances in the capacitive DAC. For example, a 6-bit configuration can be implemented by setting the number of cycles to three and using reference voltages Vref/4, Vref/16, and Vref/64, and six capacitances C1, C2, C3, C4, C5, and C6. The relationship among the six capacitances is 16*C1=8*C2=4*C3=2*C4=C5=C6.

Furthermore, in the above-described example, 2 bits are converted per cycle. However, the resolution per cycle can be optionally set. This can be achieved by increasing the number of amplifiers, the number of comparators, the number of capacitances in the capacitive DAC, and the number of reference voltages.

The specification illustrates the single-ended circuit for simplification of description. However, the circuit may be configured using a differential circuit.

Furthermore, the specification describes the ground voltage. However, any fixed voltage may be used.

In the differential circuit, the ground voltage serves as a common voltage (the central voltage of the differential signal). The common voltage can be generated by short-circuiting a signal line between a positive circuit and a negative circuit included in the differential circuit.

As described above, the present embodiment enables a reduction in the circuit area in a multiple bit/cycle AD converter design by applying the circuit according to the first embodiment to a successive approximation AD converter.

[Third Embodiment]

Figure 8:
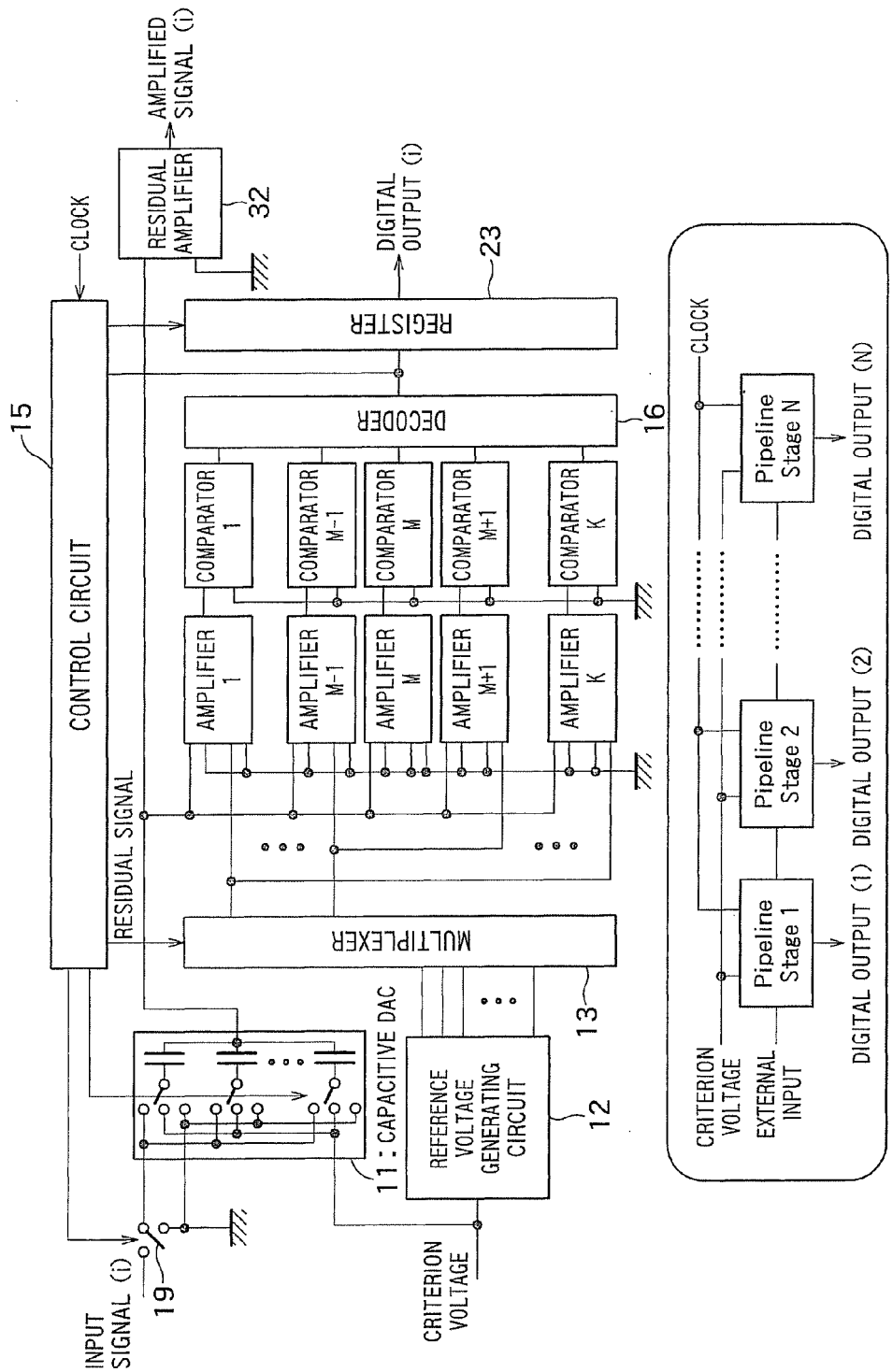
FIG. 8 is a diagram showing a basic AD converter configured by application of the circuit in FIG. 1 and a pipelined AD converter obtained by connecting a plurality of the basic AD converters together.

FIG. 8 shows a residual signal generating circuit (basic AD converting circuit) according to a third embodiment and a pipelined AD converter obtained by cascading a plurality of the basic AD converting circuits together. The basic AD converting circuit (shown on the upper side of FIG. 8) is one configuration of the stages forming the pipelined AD converter. The pipelined AD converter (shown on the lower side of FIG. 8) is formed by connecting a predetermined number of the circuits together so as to form the corresponding stages. Circuit components with the same names as those in FIG. 1 are denoted by the same reference numerals in FIG. 1, and duplicate descriptions are omitted except for expanded processing.

Compared to the circuit in FIG. 1, the circuit in FIG. 8 additionally includes a residual signal amplifier 32 and a register 23. Pipelined AD conversion can be achieved by cascading a plurality of the circuits in FIG. 8 together and allowing each of the circuits to operate in a pipelined manner. The register 23 stores the results of an AD conversion (the results of decoding) for each stage. The set of results of the AD conversion for each stage corresponds to the results of AD conversion of the input signal.

Figure 9:
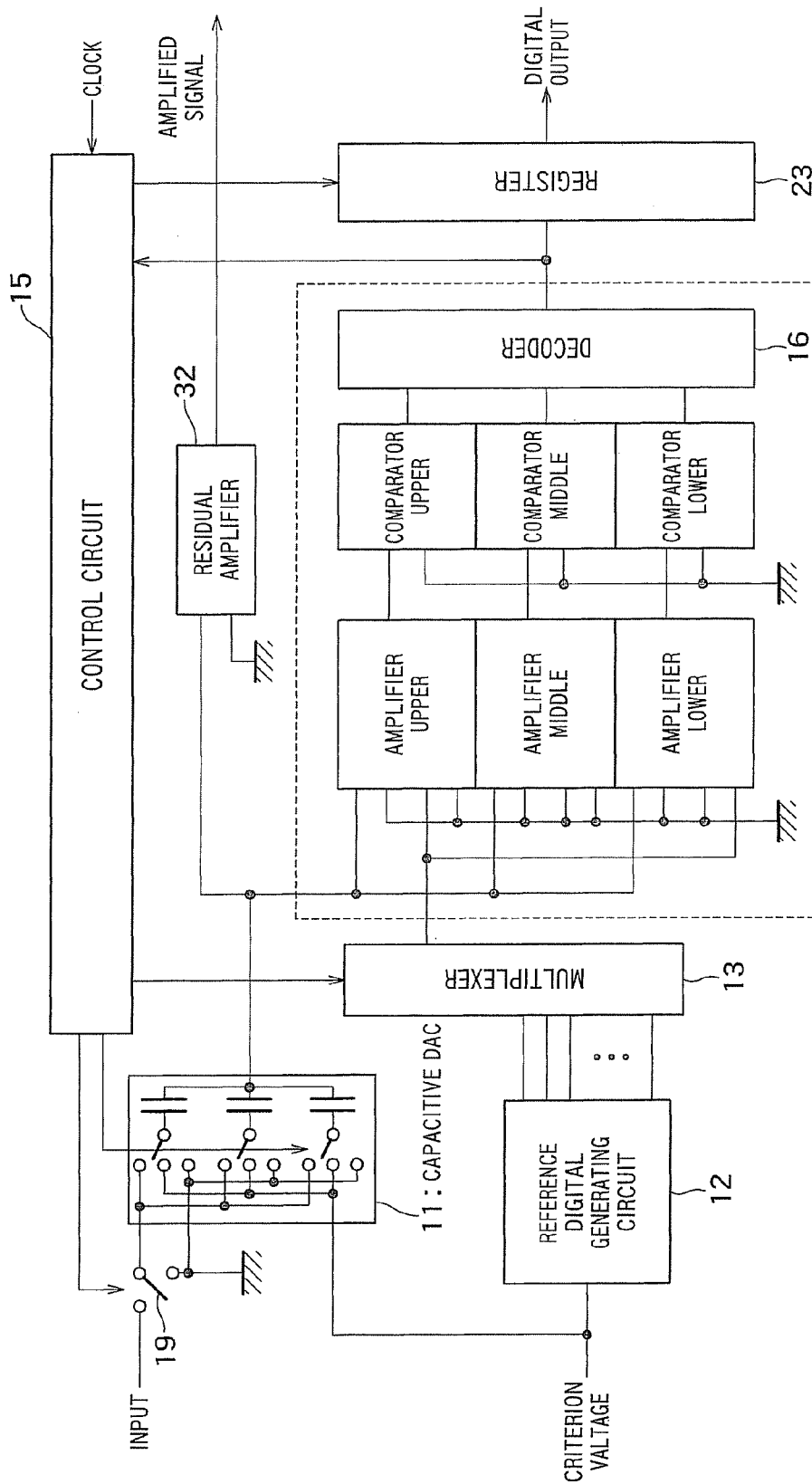
FIG. 9 is a diagram of a configuration of the basic AD converter which uses a resolution of 2 bits for AD conversion.

For easy understanding of the present embodiment, FIG. 9 shows a basic AD converting circuit that carries out a 2-bit AD conversion in one cycle. For simplification of description, illustration of the pipelined AD converter is omitted. The multiplexer 13 selects the partial voltage signal (reference voltage) Vref/4 for all the stages.

Figure 10:
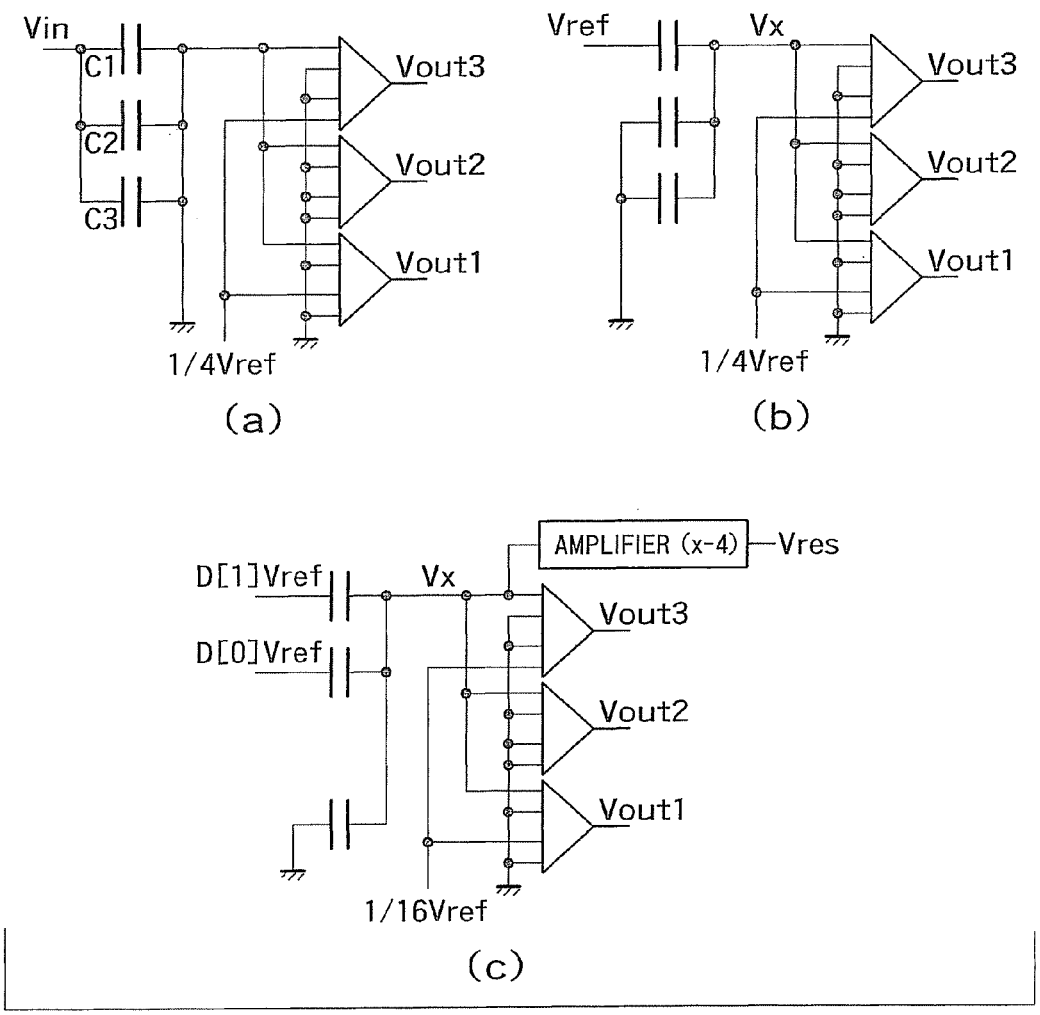
FIG. 10 is a diagram illustrating operation of the circuit in FIG. 9.

FIG. 10 is a diagram illustrating operation of the circuit in FIG. 9. The operation of the present circuit is roughly classified into three phases, a signal sampling phase in FIG. 10(a), an AD converting phase in FIG. 10(b), and a residual amplifying phase in FIG. 10(c). A capacitive DAC 11 includes three capacitances C1, C2, and C3, and the relationship among the capacitances is 2*C1=C2=C3.

The operation in FIG. 10(a) and FIG. 10(b) is similar to the cycle 1 of basic operation of the successive approximation AD converter described in FIG. 7 (FIG. 7(a) and FIG. 7(b)). Signals obtained by the AD converting operation in FIG. 10(b) are D[1] and D[0] (2 bits).

The successive approximation AD converter and the pipelined AD converter differ in a residual amplifying phase. The pipelined AD converter amplifies a residual signal to generate an output signal for the next stage. The residual signal to be output to the next stage is specifically referred to as a residual output signal. The amplified residual output signal serves as an input signal to the basic AD converting circuit in the next stage. This signal is processed in the residual amplifier phase. The residual amplifier 32 operates to amplify the residual output signal in accordance with the input range of the basic AD converting circuit in the next stage.

In the residual amplifying phase in FIG. 10(c), the results D[1] and D[0] obtained during the AD converting phase are used to generate a residual signal (residual output signal), and the residual output signal is amplified. The generated residual output signal (Vx) can be calculated by:

$$V_x = -V_{in} + \frac{1}{2}D[1]V_{ref} + \frac{1}{4}D[0]V_{ref} \quad (15)$$

The amplification factor of residual amplification varies depending on the resolution of the basic AD converting circuit. In general, the amplification factor is $2^A$ if the resolution of the basic AD converting circuit is A bits. For 2 bits, the amplification factor is set to 4. The output signal is set to have a positive polarity, and thus the amplification factor is −4. "x−4" shown in FIG. 10(c) indicates that the amplification factor is −4. When the signal obtained by the residual amplifier is denoted by "Vres", the following expression is given.

$$V_{res} = 4V_{in} - 2D[1]V_{ref} - D[0]V_{ref} \quad (16)$$

Figure 11:
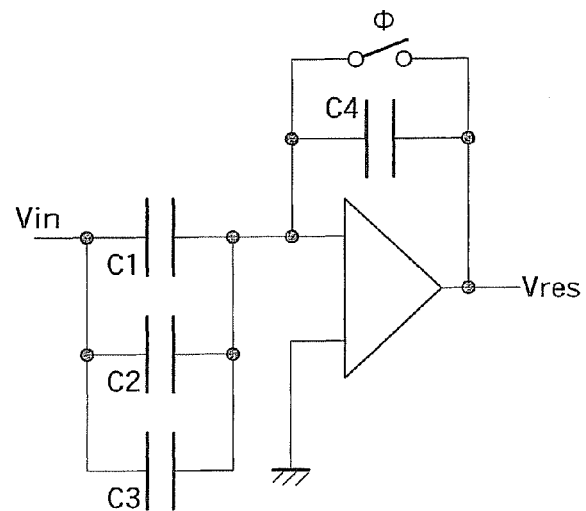
FIG. 11 is a diagram showing a specific example of a residual amplifier.

Several methods are available for implementing a residual amplifier. By way of example, FIG. 11 shows an example of a configuration using a switched capacitor circuit. "C1", "C2", and "C3" shown in FIG. 11 denote capacitances forming the capacitive DAC 11. An additional circuit for residual amplification includes a capacitance C4 and an amplifier.

Figure 12:
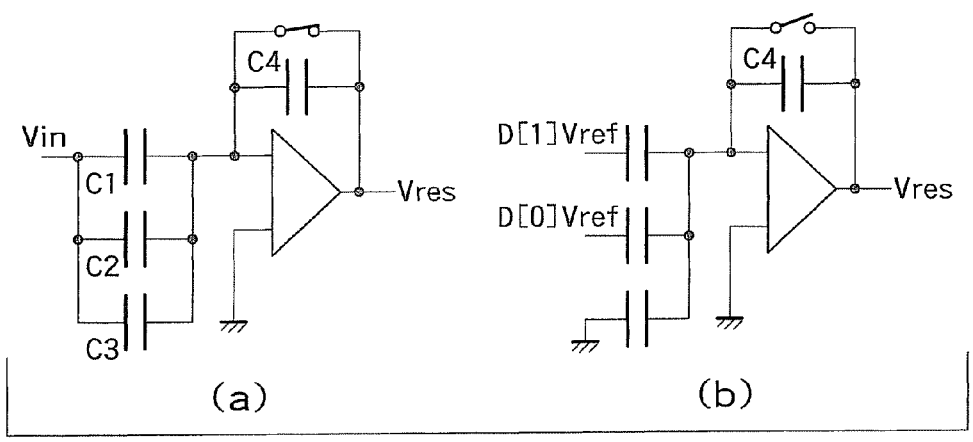
FIG. 12 is a diagram illustrating the operational principle of the residual amplifier in FIG. 11.

The present circuit operates in two phases, that is, C4 capacitive discharge shown in FIG. 12(a) (Φ=1) and residual amplification shown in FIG. 12(b) (Φ=0). The phase in FIG. 12(a) is carried out during signal sampling (see FIG. 10(a)). The phase in FIG. 12(b) corresponds to the phase shown in FIG. 10(c). In the phase in FIG. 12(b), a residual output signal is generated and amplified using the Vref, which is indicative of a criterion voltage. The output Vres from this circuit is expressed by:

$$V_{res} = \frac{C1+C2+C3}{C4}V_{in} - \frac{C1}{C4}D[1]V_{ref} - \frac{C2}{C4}D[0]V_{ref} \quad (17)$$
$$= 4V_{in} - 2D[1]V_{ref} - D[0]V_{ref}$$

Thus, residual amplification with an amplification factor of 4 can be achieved.

This example illustrates the 2-bit configuration as an example of the basic AD converting circuit. However, any bits can be dealt with by increasing the number of the reference voltages, the number of capacitances in the capacitive DAC, the number of amplifiers, the number of comparators, and the amplification factor of the amplifiers.

For example, a 3-bit configuration can be implemented by using reference voltages Vref/8, 2*Vref/8, and 3*Vref/8, and four capacitances (4*C4=2*C3=C2=C1) (if the configuration of the residual amplifier is as shown in FIG. 11, the amplification factor is automatically changed by changing the capacitive DAC. Thus, no change is made to the circuit of the residual amplifier itself).

The specification illustrates the single-ended circuit for simplification of description. However, the circuit may be configured using a differential circuit.

Furthermore, the specification describes the ground voltage. However, any fixed voltage may be used.

In the differential circuit, the ground voltage serves as a common voltage (the central voltage of a differential signal). The common voltage can be generated by short-circuiting a signal line between a positive circuit and a negative circuit included in the differential circuit.

As described above, the present embodiment enables a reduction in the circuit area in a multiple bit/cycle AD converter design by applying the circuit according to the first embodiment to a pipelined AD converter.

[Fourth Embodiment]

Figure 13:
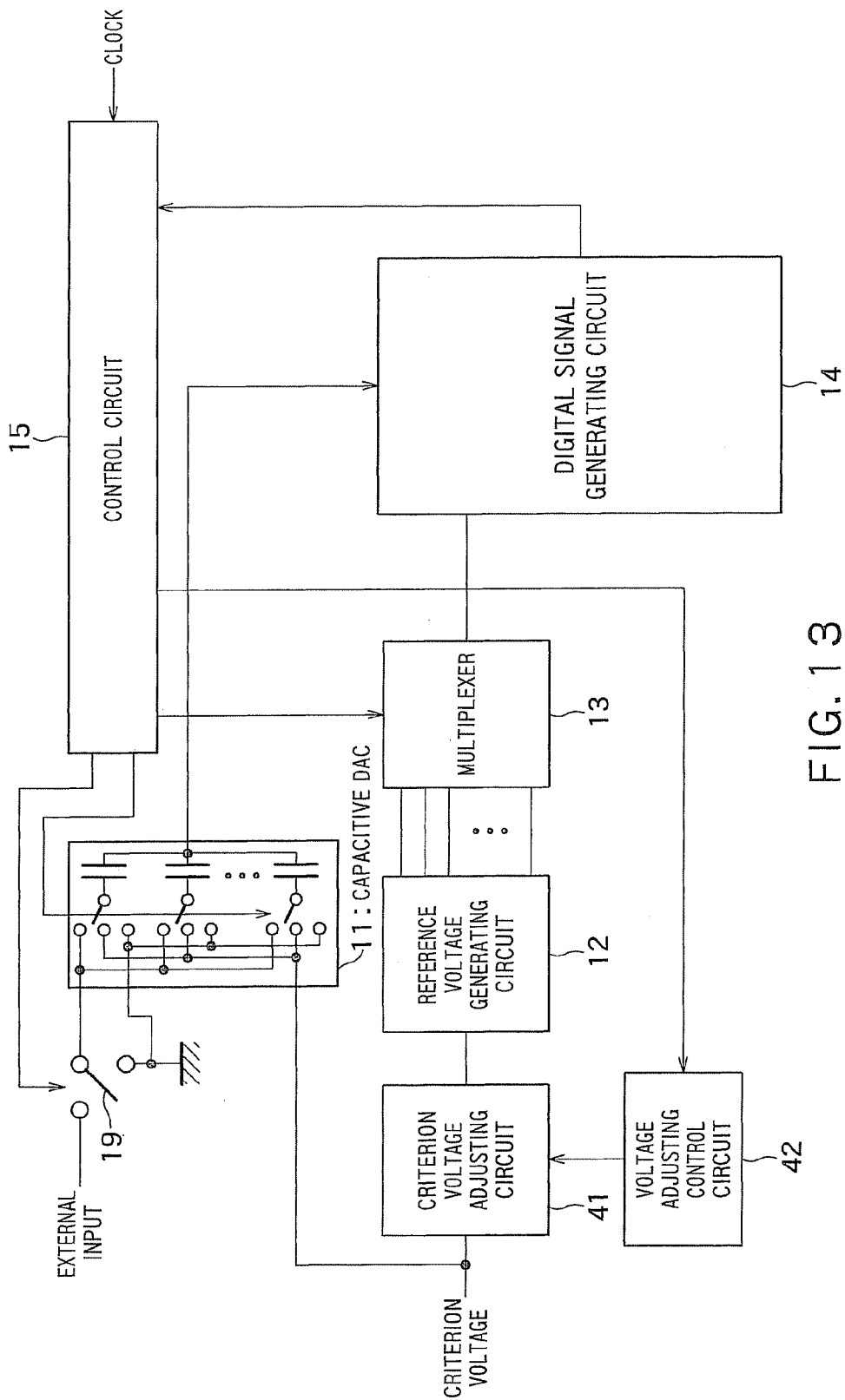
FIG. 13 is a diagram showing a residual signal generating circuit including a configuration that cancels the adverse effect of an error caused by a parasitic capacitance.

FIG. 13 shows a residual signal generating circuit according to a fourth embodiment. A criterion voltage adjusting circuit 41 and a voltage adjusting control circuit 42 are added to the circuit show in FIG. 1. The voltage adjusting control circuit 42 transmits information indicating a value by which the criterion voltage is multiplied, to the criterion voltage adjusting control circuit 41 in accordance with an instruction from the control circuit 15. The criterion voltage adjusting circuit 41 generates a voltage by multiplying a criterion voltage by the value according to the information. The criterion voltage adjusting circuit 41 then outputs the generated voltage to the reference voltage generating circuit 12. The digital signal generating circuit 14 shown in FIG. 13 includes a plurality of amplifiers, a plurality of comparators, and a decoder, and has the same configuration as that of the digital signal generating circuit shown in FIG. 1. A purpose of the circuit in FIG. 13 is to prevent miscoding caused by the adverse effect of a parasitic capacitance.

Figure 14:
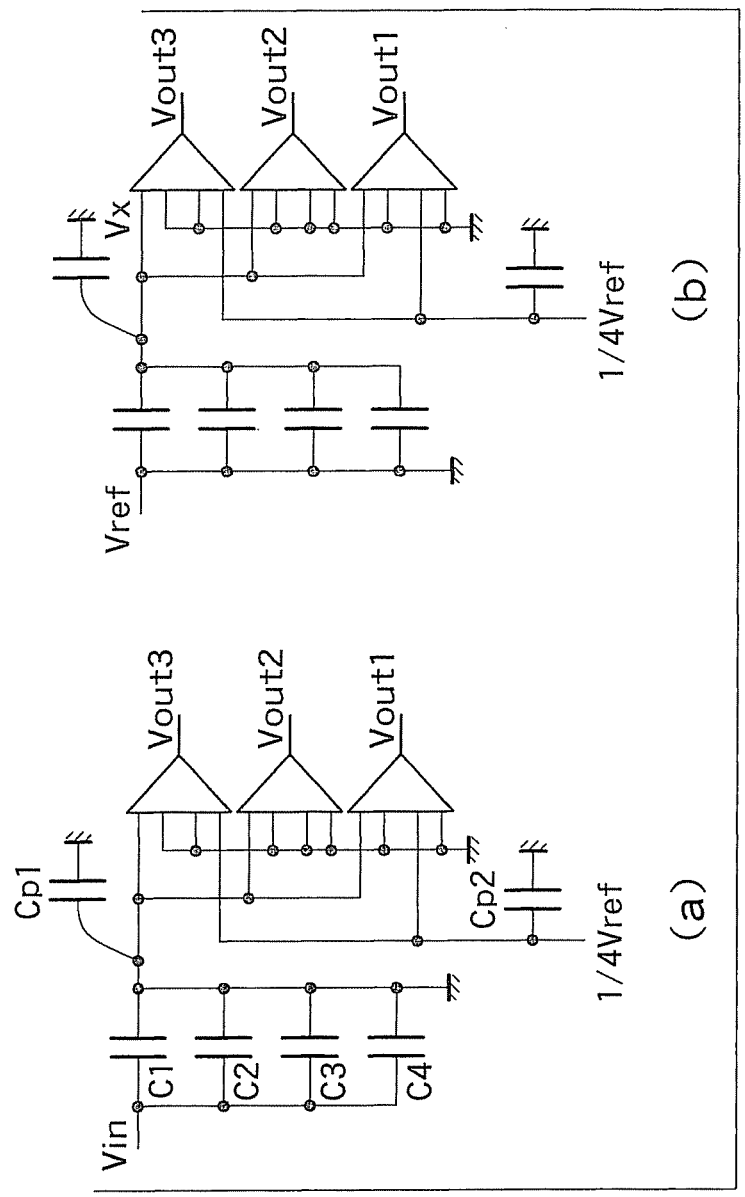
FIG. 14 is a diagram illustrating operation of the circuit in FIG. 13.

FIG. 14 is a diagram illustrating the principle of miscoding that occurs when a parasitic capacitance is present. FIG. 14 shows an example of a 2-bit AD conversion carried out in one cycle. The capacitive DAC 11 includes four capacitances C1, C2, C3, and C4. The relationship among the capacitances is 4*C1=2*C2=C3=C4. Furthermore, the reference voltage generating circuit 12 generates a reference voltage Vref/4.

As shown in FIG. 14(a), roughly two parasitic capacitances Cp1 and Cp2 are present in the circuit in FIG. 13. "Cp1" denotes a parasitic capacitance in wiring between the capacitive DAC and each amplifier. "Cp2" denotes a parasitic capacitance in wiring between output of the multiplexer and each amplifier. The parasitic capacitance of the wiring includes a gate capacitance of the amplifier. With the Cp1 taken into account, the difference signal Vx (see FIG. 14(b)) can be calculated as follows.

$$V_x = \frac{C1+C2+C3+C4}{C1+C2+C3+C4+Cp1}\left\{-V_{in}+\frac{1}{2}V_{ref}\right\} \quad (18)$$
$$= (1+\alpha)\left\{-V_{in}+\frac{1}{2}V_{ref}\right\}$$

That is, compared to an ideal condition without the Cp1, the presence of the Cp1 reduces the voltage amplitude of the Vx by a factor of (1+α). This problem is inherent in circuits using capacitances. This is because the capacitances C1, C2, C3, C4, and Cp1 are in a series connected relationship, resulting in partial voltages.

On the other hand, the reference signal has a value Vref/4 regardless of the value of the parasitic capacitance Cp2. This assumption holds true if the reference voltage generating circuit 12 uses resistance or contains a driving circuit within the circuit. In actuality, an increase in time constant caused by parasitic capacitances tends to increase a signal response time, but the value obtained after the response is Vref/4.

Thus, the adverse effect of parasitic capacitances causes an error in amplitude between a difference signal and a reference signal. The error in amplitude affects outputs from the amplifiers as follows.

$$V_{out3} = (1+\alpha)\left\{-V_{in}+\frac{1}{2}V_{ref}+\frac{1}{4(1+\alpha)}V'_{ref}\right\} \quad (19)$$
$$= (1+\alpha)\left\{-V_{in}+\frac{3-\alpha}{4}V_{ref}\right\}$$

$$V_{out2} = (1+\alpha)\left\{-V_{in}+\frac{1}{2}V_{ref}\right\} \quad (20)$$

$$V_{out3} = (1+\alpha)\left\{-V_{in}+\frac{1}{2}V_{ref}-\frac{1}{4(1+\alpha)}V'_{ref}\right\} \quad (21)$$
$$= (1+\alpha)\left\{-V_{in}+\frac{1+\alpha}{4}V_{ref}\right\}$$

Here, the amplification factor of the amplifiers is assumed to be 1, and the error is linearly approximated. Furthermore, Vref'=Vref ("Vref'" denotes a reference signal input to the amplifier. After the response, Vref'=Vref). In this manner, when an error in amplitude occurs, the error is mixed into a residual signal, resulting in miscoding.

The fourth embodiment proposes a technique for correcting the error in amplitude. Specifically, the criterion voltage adjusting circuit 41 in FIG. 13 adjusts the criterion voltage. For example, a circuit shown in FIG. 14 can cancel the adverse effect of the error by adjusting the criterion voltage to (1+α)*Vref/4 through multiplication by (1+α). This means that the Vref' in Expressions (19) and (21) is changed to (1+α)Vref. Thus, the present circuit has the function to adjust the criterion voltage and can thus cancel the error factor resulting from parasitic capacitances. This enables a very accurate AD converter to be designed.

Figure 15:
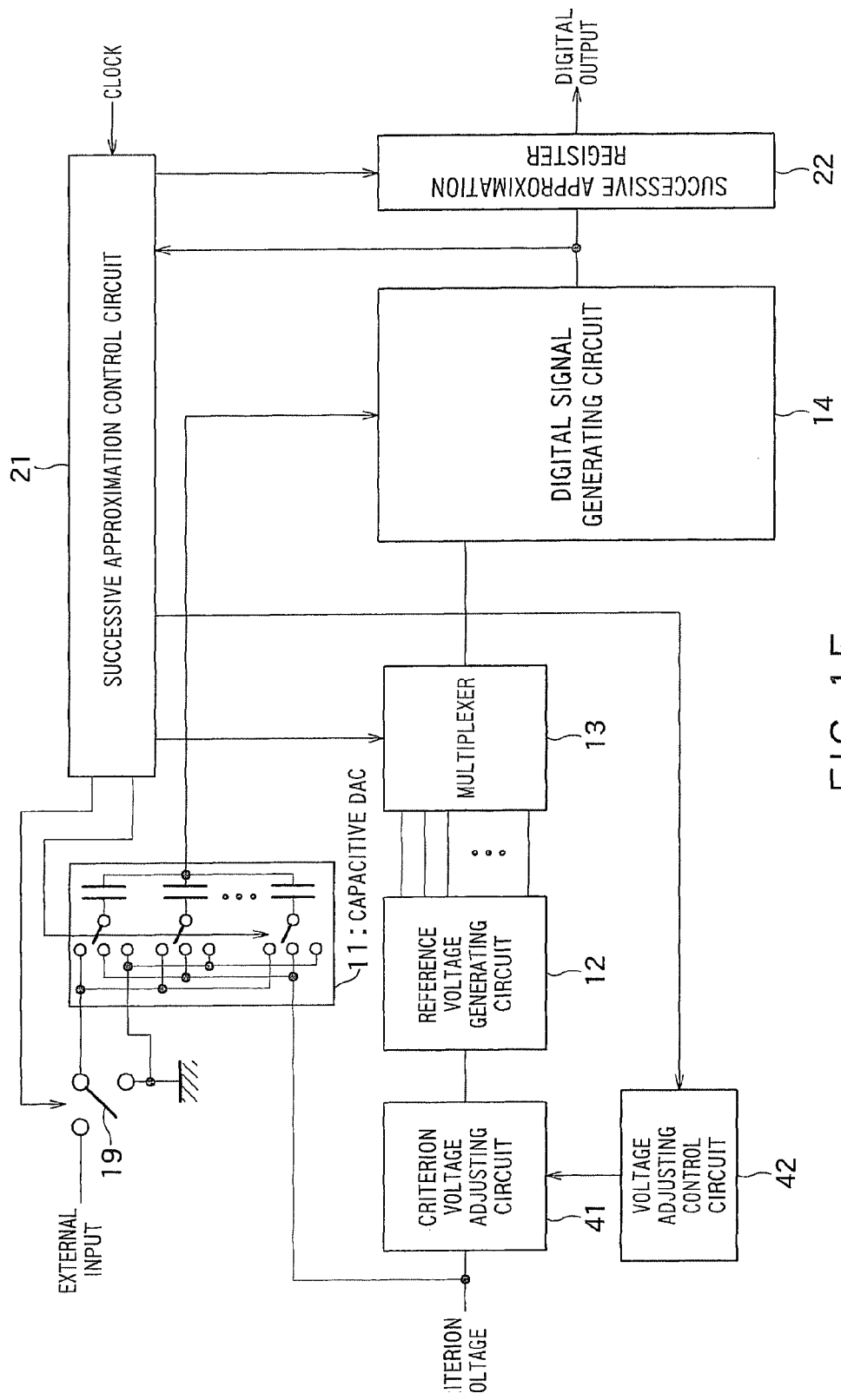
FIG. 15 is a diagram showing a successive approximation AD converter configured by application of the circuit in FIG. 13.
Figure 16:
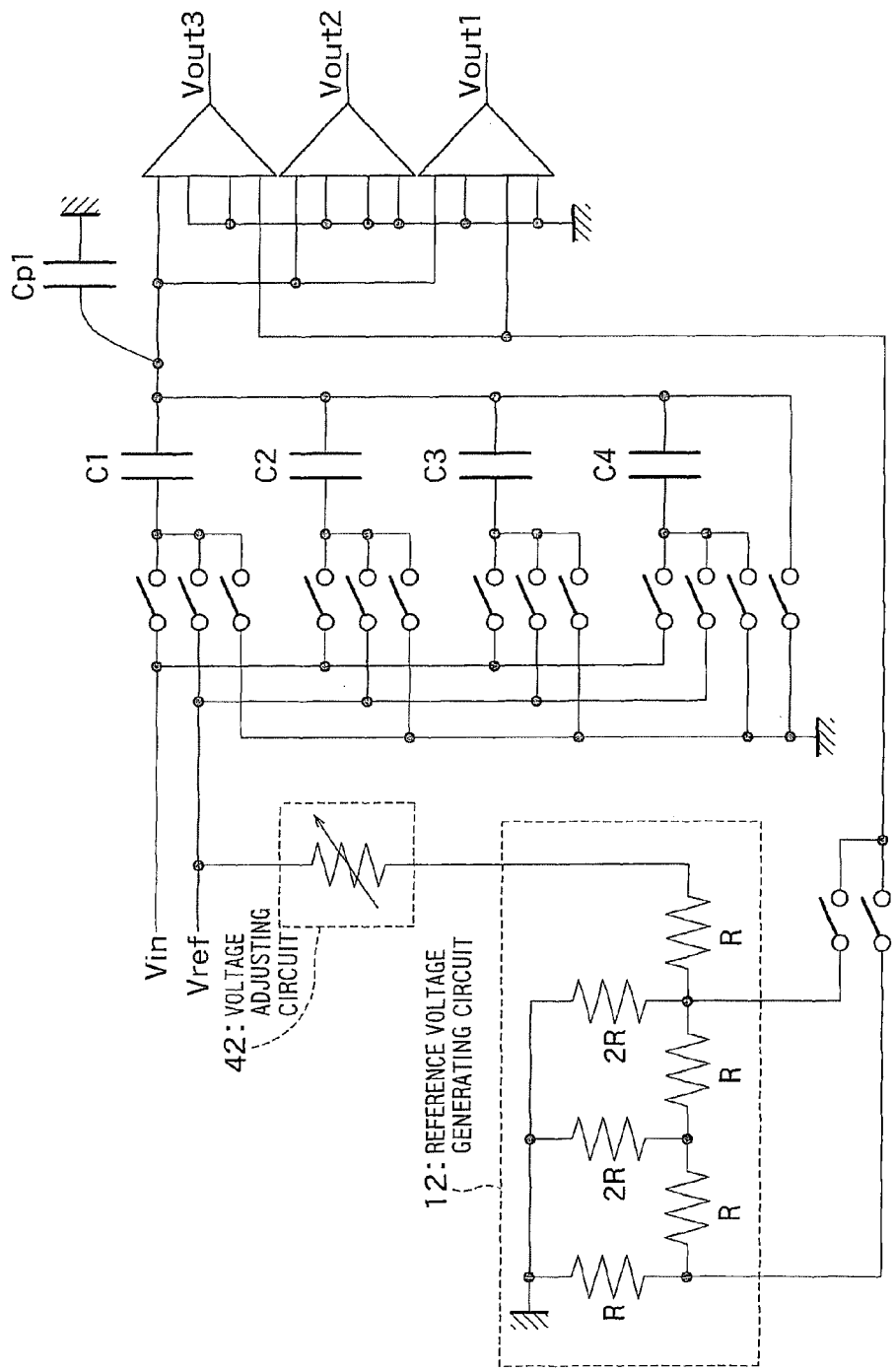
FIG. 16 is a diagram showing a part of a specific example of the circuit in FIG. 15.

FIG. 15 shows an example in which the fourth embodiment is applied to the successive approximation AD converter. In the present circuit, the successive approximation control circuit 21 is the control circuit in FIG. 13, and the successive approximation register 22 is additionally provided. FIG. 16 shows a part of a specific configuration of the circuit in FIG. 15. This circuit is a part of a successive approximation AD converter that carries out a 2-bit AD conversion per cycle, and in this example, provides a resolution of 4 bits for two cycles of successive approximation. An R-2R partial voltage circuit is used as the reference voltage generating circuit 12. The capacitances C1, C2, C3, and C4 and a group of switches connected to the capacitances correspond to the capacitive DAC 11.

Residual signals during the first cycle are the same as that expressed by Expressions (19), (20), and (21). Residual signals during the second cycle are expressed by:

$$V_{out3} = (1+\alpha)\left\{-V_{in}\frac{1}{2}V_{ref} + \frac{1}{4}V_{ref} + \frac{1}{8}V_{ref} + \frac{1}{16(1+\alpha)}V'_{ref}\right\} \quad (22)$$

$$= (1+\alpha)\left\{-V_{in}\frac{1}{2}V_{ref} + \frac{1}{4}V_{ref} + \frac{3-\alpha}{16}V_{ref}\right\}$$

$$V_{out2} = (1+\alpha)\left\{-V_{in} + \frac{1}{2}V_{ref}\right\} \quad (23)$$

$$V_{out3} = (1+\alpha)\left\{\begin{array}{l}-V_{in} + \frac{1}{2}D[2]V_{ref} + \frac{1}{4}D[1]V_{ref} + \frac{1}{8}V_{ref} - \\ \frac{1}{16(1+\alpha)}V'_{ref}\end{array}\right\} \quad (24)$$

$$= (1+\alpha)\left\{-V_{in} + \frac{1}{2}D[2]V_{ref} + \frac{1}{4}D[1]V_{ref} + \frac{1+\alpha}{16}V_{ref}\right\}$$

The voltage adjusting circuit 42 adjusts the criterion voltage so as to cancel an error in amplitude between a differential signal and a reference signal. It should be noted that the value of the Vref' is set to (1+α)Vref both in the cycle 1 and in the cycle 2. That is, adjusting the Vref, corresponding to a criterion, allows an AD conversion to be achieved without an error both in the cycle 1 and in the cycle 2.

The circuit adjusts the criterion voltage using variable resistance. The Vref' can be reduced by increasing the resistance value of the variable resistance and increased by reducing the resistance value.

The reference voltage generating circuit 12 shown in FIG. 16 is formed of a resistor. Alternatively, the reference voltage generating circuit 12 may be implemented using a circuit such as a capacitive DAC, that is, a circuit that generates any voltage using a plurality of capacitances. In this case, the capacitance Cp2 (see FIG. 14(a)) affects the amplitude of the reference signal. If the rate of attenuation of the amplitude caused by the adverse effect of the Cp1 is exactly the same as the rate of attenuation of the amplitude caused by the adverse effect of the Cp2, the adverse effects are cancelled, eliminating the need for voltage adjustment. However, in actuality, controlling the parasitic capacitances Cp1 and Cp2 during a manufacturing process is difficult, and a mismatch problem occurs as in the case of the resistance. Even in this case, the present embodiment can cancel the adverse effect of the error caused by parasitic capacitances by adjusting the voltages.

The present example assumes that the AD converting cycle includes two phases for description. However, the above description also applies to a case of at least three phases. Furthermore, the example illustrates the circuit that carries out a 2-bit AD conversion (decoding) per cycle. However, circuits that carry out an AD conversion of at least 3 bits can also cancel the adverse effects of parasitic capacitances.

The specification illustrates the single-ended circuit for simplification of description. However, the circuit may be configured using a differential circuit.

Furthermore, the specification describes the ground voltage. However, any fixed voltage may be used.

In the differential circuit, the ground voltage serves as a common voltage (the central voltage of the differential signal). The common voltage can be generated by short-circuiting a signal line between a positive circuit and a negative circuit included in the differential circuit.

[Fifth Embodiment]

Figure 17:
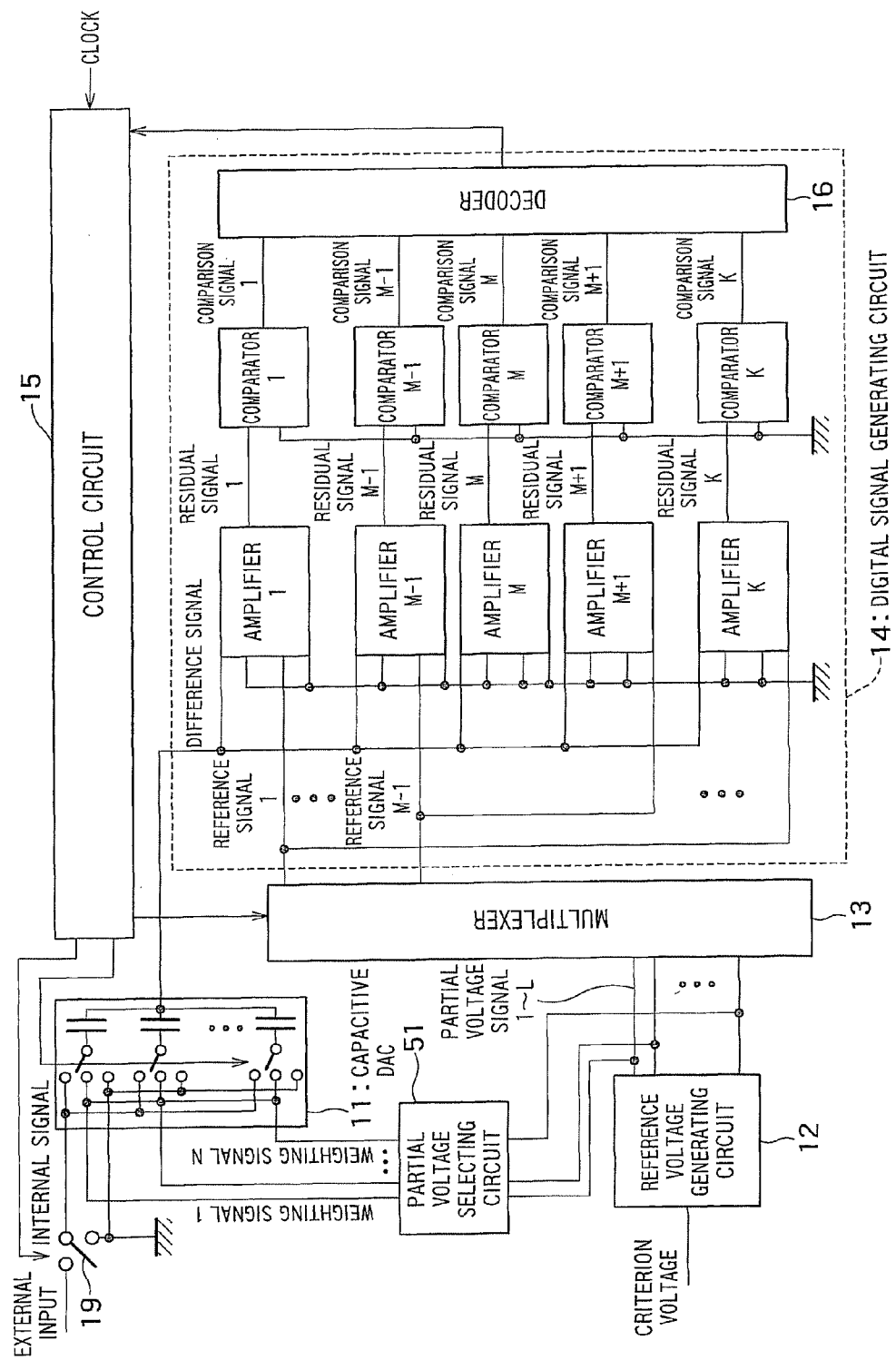
FIG. 17 is a diagram showing a residual signal generating circuit according to a fifth embodiment.

FIG. 17 shows a residual signal generating circuit according to a fifth embodiment. The present embodiment enables the capacitive DAC in the circuit shown in FIG. 1 to be simplified. The basic circuit configuration is similar to the basic circuit configuration in FIG. 1 except that a plurality of reference voltages (partial voltage signals) are connected to the capacitances forming the capacitive DAC. Furthermore, each of the capacitances forming the capacitive DAC is not weighted (that is, the capacitances have the same value). A partial voltage signal selecting circuit 51 connects only those of a plurality of signal lines which are required for the capacitive DAC, to the capacitive DAC. "Weighting signals" shown in FIG. 17 represent partial voltage signals (reference voltages) selected by the partial voltage signal selecting circuit 51.

Figure 18:
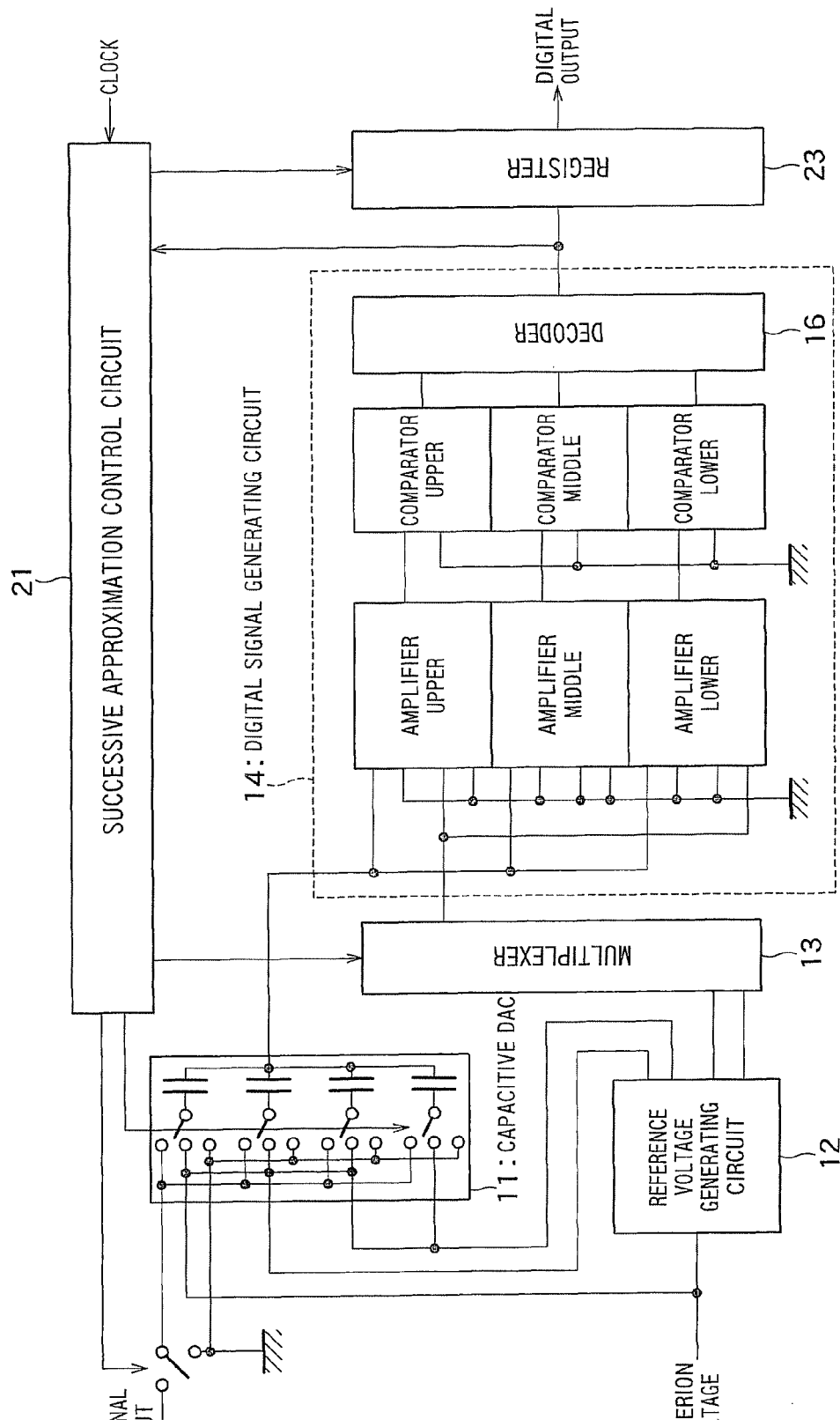
FIG. 18 is a diagram showing a successive approximation AD converter configured by application of the circuit in FIG. 17 particularly when the AD converter uses a resolution of 4 bits for AD conversion.

For easy understanding of the present circuit, FIG. 18 shows a configuration in which the circuit in FIG. 17 is applied to a successive approximation AD converter that carries out a 4-bit AD conversion. The 4-bit AD conversion is carried out in two cycles, and the resolution per cycle is 2 bits. Unlike in the circuit in FIG. 2, in the circuit in FIG. 18, the capacitances forming the capacitive DAC have the same value, and different voltages are connected to the respective capacitances. The reference voltage generating circuit 12 generates four types of partial voltage signals Vref/2, Vref/4, Vref/8, and Vref/32.

Figure 19:
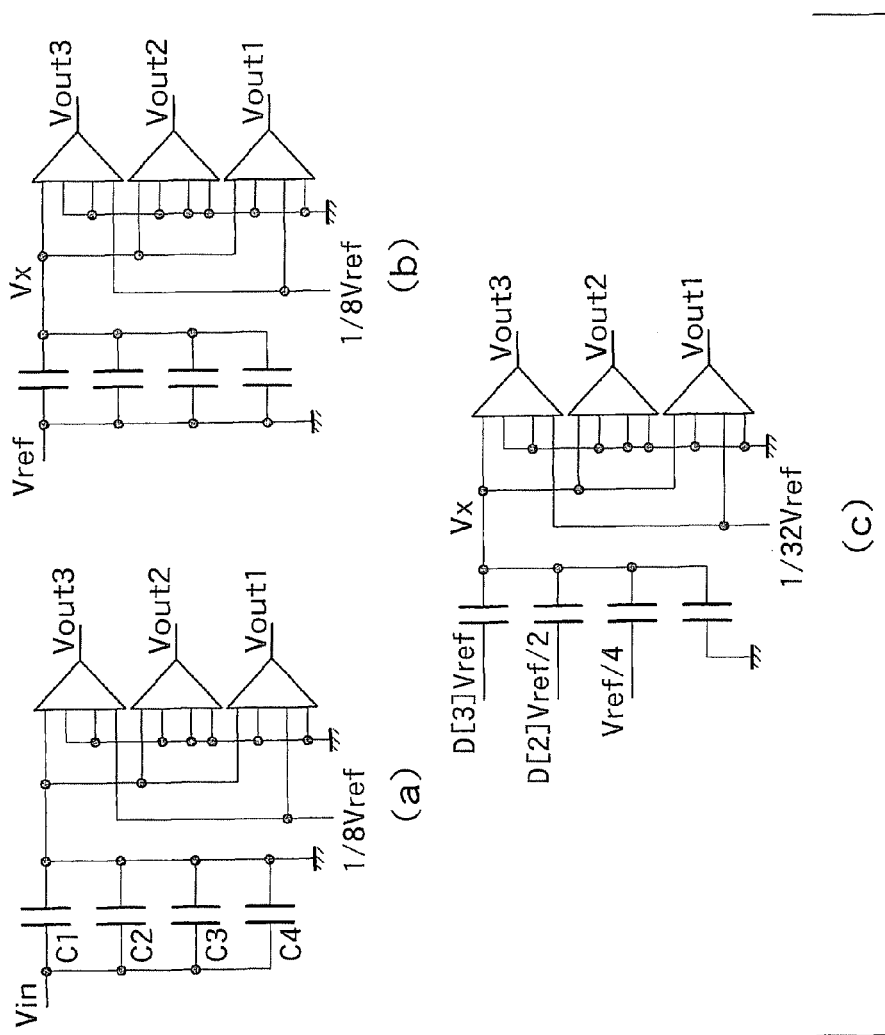
FIG. 19 is a diagram illustrating operation of the circuit in FIG. 18.

FIG. 19 is a diagram illustrating operation of the circuit in FIG. 18. The capacitive DAC includes four capacitances C1, C2, C3, and C4, and the relationship among the capacitances is C1=C2=C3=C4. The operation of the present circuit includes signal sampling in FIG. 19(a), an AD converting cycle 1 in FIG. 19(b), and an AD converting cycle 2 in FIG. 19(c).

The circuit operation in FIG. 19(a) and FIG. 19(b) is the same as the circuit operation shown in FIG. 7(a) and FIG. 7(b) except that a reference signal used in FIG. 19(b) is Vref/8 instead of Vref/4 used in FIG. 7(b). In the present circuit, the difference signal Vx obtained during the AD converting cycle 1 in FIG. 19(b) is expressed by:

$$V_x = -V_{in} + \frac{1}{4}V_{ref} = -V_{in} + \frac{1}{2}\frac{V_{ref}}{2} \quad (25)$$

Furthermore, the residual signals Vout1, Vout2, and Vout3 obtained during the AD converting cycle 1 in FIG. 19(b) are expressed by:

$$V_{out1} = -V_{in} + \frac{1}{4}V_{ref} - \frac{1}{8}V_{ref} = -V_{in} + \frac{1}{4}\frac{V_{ref}}{2} \quad (26)$$

$$V_{out2} = -V_{in} + \frac{2}{4}\frac{V_{ref}}{2} \quad (27)$$

-continued $$V_{out3} = -V_{in} + \frac{1}{4}V_{ref} + \frac{1}{8}V_{ref} = -V_{in} + \frac{3}{4}\frac{V_{ref}}{2} \quad (28)$$

These expressions indicate that binary weighting of the capacitances can be achieved by doubling the criterion voltage Vref, which is indicative of full scale of the AD converter. This example of calculations illustrates the operation only during the first cycle. However, similar calculations can be carried out for the second cycle, that is, the AD converting cycle 2 shown in FIG. 19(c), resulting in Expressions (12), (13), and (14) shown above. During the second cycle, the Vref/32 is selected as a reference signal. The Vref/2 is connected to the second capacitance from the top of the sheet of FIG. 19(c), and the Vref/4 is connected to the third capacitance from the top of the sheet of FIG. 19(c).

Thus, the present circuit eliminates the need for weighting of the capacitances forming the capacitive DAC, thus enabling a reduction in the number of capacitances. For example, in the circuit in FIG. 7 requires a total of eight capacitances in order to set the capacitances to the same value. In contrast, the circuit according to the present embodiment requires only four capacitances. Furthermore, the circuit according to the present embodiment utilizes the reference voltage, thus eliminating the need for addition of a circuit that generates weighting voltages. This enables a reduction in circuit area. Additionally, the partial voltage signal selecting circuit 51 connects only those of a plurality of signal lines which are required for the capacitive DAC, to the capacitive DAC, and thus involves no electric operation or power consumption.

[Sixth Embodiment]

Figure 20:
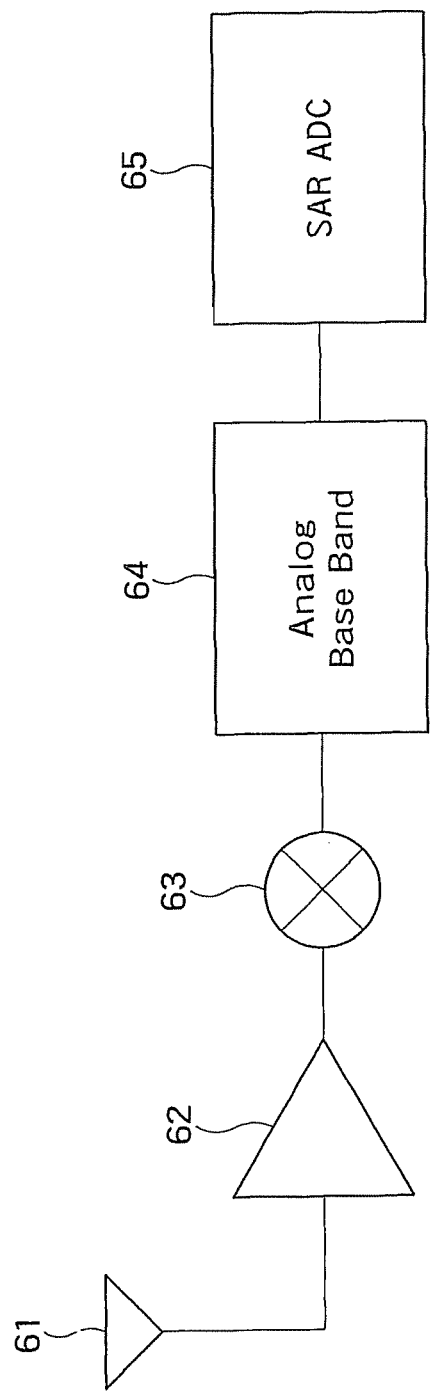
FIG. 20 is a diagram showing a radio receiver with a successive approximation AD converter according to one embodiment.

FIG. 20 shows a radio receiver with the above-described successive approximation AD converter (FIG. 5, FIG. 6, FIG. 15, FIG. 18, or the like).

The radio receiver includes an antenna 61, an LNA 62, a mixer 63, an analog baseband circuit 64, and a SARAD converting circuit 65. Instead of the SARAD converting circuit, an AD converting circuit (residual signal generating circuit) or a pipelined AD converter may be arranged.

A radio signal received by the antenna 61 is amplified by the LNA (Low Noise Amplifier) 62. The signal with a radio frequency amplified by the LNA 62 is downconverted into a baseband signal by the mixer 63. The analog baseband circuit 64 carries out a filtering process on the baseband signal to obtain a signal in a desired band. Then, the SARAD converting circuit 65 converts the filtered analog signal into a digital signal. The digital signal is demodulated by a circuit in a succeeding stage which is not shown.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A residual signal generating circuit comprising:
a capacitive DA converter to generate a first difference signal with respect to an input signal based on a criterion voltage, the criterion voltage being indicative of an input range of the input signal;
a reference voltage generating circuit to divide the criterion voltage to obtain at least one partial voltage signal;
a residual signal generating section to generate $2^N-1$ (N is an integer equal to or greater than 2) first residual signal according to a difference between the first difference signal and $2^{N-1}-1$ first reference signal, the $2^{N-1}$-first reference signal being $2^{N-1}-1$ partial voltage signal among said at least one partial voltage signal generated by the reference voltage generating circuit;
a comparator to compare the $2^N-1$ first residual signal with a fixed voltage to obtain $2^N-1$ first comparison signal each indicative of a logical value; and
a decoder configured to decode the $2^N-1$ first comparison signal to obtain first data of N bits.

2. A successive approximation AD converter comprising:
the residual signal generating circuit according to claim 1; and
a register to store first data obtained by the decoder,
wherein (A) the capacitive DAC generates an X+1th difference signal with respect to the input signal based on Xth (X is an integer equal to or greater than 1 and equal to or smaller than H) data obtained by the decoder,
(B) the residual signal generating section generates $2^N-1$ X+1th residual signal according to a difference between the X+1th difference signal and $2^{N-1}-1$ X+1th reference signal, the $2^{N-1}-1$ X+1th reference signal being $2^{N-1}-1$ partial voltage signal among said at least one partial voltage signal generated by the reference voltage generating circuit,
(C) the comparator compares the $2^{N-1}-1$ X+1th residual signal with the fixed voltage to obtain $2^N-1$ X+1th comparison signal,
(D) the decoder decodes the $2^{N-1}-1$ X+1th comparison signal to obtain X+1th data of N bit,
(E) the register stores the X+1th data, and
the (A), (B), (C), (D), and (E) are repeated and a set of the first data to the H+1th data stored in the register is output as a result of AD conversion of the input signal.

3. A radio receiver comprising:
an antenna to receive a radio signal;
an amplifier to amplify the radio signal received by the antenna;
a mixer to convert the signal amplified by the amplifier into a baseband signal;
an analog baseband section to filter the baseband signal; and
a residual signal generating circuit, a successive approximation AD converter, or a pipelined successive approximation AD converter according to claim 2 to subject the filtered signal to an AD conversion.

4. A pipelined AD converter comprising:
a first basic AD converter to an R−1th (R is an integer equal to or greater than 2) basic AD converter each including the residual signal generating circuit according to claim 1, a register to store first data obtained by the decoder, and a residual amplifier to amplify a residual output signal generated by the capacitive DAC based on the first data; and
an Rth basic AD converter including the residual signal generating circuit according to claim 1 and a register to store first data obtained by the decoder, wherein each of the second to Rth basic AD converters receives the residual output signal generated by a corresponding one of the first to R−1th basic AD converters as the input signal, and a set of the first data stored in the each register of the first to Rth basic AD converters is output as a result of AD conversion of the input signal.

5. A radio receiver comprising:

an antenna to receive a radio signal;

an amplifier to amplify the radio signal received by the antenna;

a mixer to convert the signal amplified by the amplifier into a baseband signal;

an analog baseband section to filter the baseband signal; and a residual signal generating circuit, a successive approximation AD converter, or a pipelined successive approximation AD converter according to claim 4 to subject the filtered signal to an AD conversion.

6. The residual signal generating circuit according to claim 1, further comprising a criterion voltage adjusting circuit to adjust the criterion voltage by multiplying the criterion voltage by a predetermined value, wherein the reference voltage generating circuit generates the partial voltage signal by dividing the criterion voltage adjusted by the criterion voltage adjusting circuit.

7. The residual signal generating circuit according to claim 1, wherein the capacitive DAC generates the first difference signal by weighting a plurality of capacitances using different voltages each of which is one of the fixed voltage and a voltage of said at least one partial voltage signal.

8. A radio receiver comprising:

an antenna to receive a radio signal;

an amplifier to amplify the radio signal received by the antenna;

a mixer to convert the signal amplified by the amplifier into a baseband signal;

an analog baseband section to filter the baseband signal; and a residual signal generating circuit, a successive approximation AD converter, or a pipelined successive approximation AD converter according to claim 1 to subject the filtered signal to an AD conversion.

* * * * *